United States Patent
Ho et al.

(10) Patent No.: US 12,165,963 B2
(45) Date of Patent: Dec. 10, 2024

(54) SUBSTRATE, SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/375,140

(22) Filed: Sep. 29, 2023

(65) Prior Publication Data

US 2024/0030120 A1    Jan. 25, 2024

Related U.S. Application Data

(63) Continuation of application No. 17/397,842, filed on Aug. 9, 2021, now Pat. No. 11,776,885, which is a (Continued)

(51) Int. Cl.
*H01L 23/498* (2006.01)
*H01L 21/48* (2006.01)
*H01L 23/31* (2006.01)

(52) U.S. Cl.
CPC .... *H01L 23/49827* (2013.01); *H01L 21/4857* (2013.01); *H01L 21/486* (2013.01); (Continued)

(58) Field of Classification Search
CPC ........... H01L 23/49827; H01L 21/4857; H01L 21/486; H01L 23/3157; H01L 23/49816; (Continued)

(56) References Cited

U.S. PATENT DOCUMENTS 11,776,885 B2 * 10/2023 Ho ..................... H01L 21/6835
257/668
2004/0065960 A1    4/2004 Egitto et al.
(Continued)

FOREIGN PATENT DOCUMENTS

EP    2 312 922 A1    4/2011

OTHER PUBLICATIONS

Final Office Action for U.S. Appl. No. 15/976,772, issued on Jul. 17, 2019, 13 pages.
(Continued)

*Primary Examiner* — Tong-Ho Kim
(74) *Attorney, Agent, or Firm* — FOLEY & LARDNER LLP

(57) ABSTRACT

A substrate includes a first dielectric layer having a first surface and a second dielectric layer having a first surface disposed adjacent to the first surface of the first dielectric layer. The substrate further includes a first conductive via disposed in the first dielectric layer and having a first end adjacent to the first surface of the first dielectric layer and a second end opposite the first end. The substrate further includes a second conductive via disposed in the second dielectric layer and having a first end adjacent to the first surface of the second dielectric layer. A width of the first end of the first conductive via is smaller than a width of the second end of the first conductive via, and a width of the first end of the second conductive via is smaller than the width of the first end of the first conductive via.

18 Claims, 32 Drawing Sheets

Related U.S. Application Data continuation of application No. 16/814,729, filed on Mar. 10, 2020, now Pat. No. 11,088,061, which is a continuation of application No. 15/976,772, filed on May 10, 2018, now Pat. No. 10,615,109.

(52) U.S. Cl.
CPC .... *H01L 23/3157* (2013.01); *H01L 23/49816* (2013.01); *H01L 23/49822* (2013.01)

(58) Field of Classification Search
CPC ..... H01L 23/49822; H01L 2224/16225; H01L 2224/73204; H01L 2221/68345; H01L 2224/32225; H01L 2924/15311; H01L 21/6835; H01L 23/562; H01L 23/49838
USPC ...................................................... 257/668
See application file for complete search history.

(56) References Cited

U.S. PATENT DOCUMENTS

| | | |
|---|---|---|
| 2011/0204505 A1 | 8/2011 | Pagaila et al. |
| 2014/0166355 A1 | 6/2014 | Hong et al. |
| 2015/0009645 A1 | 1/2015 | Kaneko et al. |
| 2015/0318235 A1 | 11/2015 | Chen et al. |
| 2018/0005846 A1 | 1/2018 | Tsai et al. |
| 2018/0138114 A1 | 5/2018 | Lee |
| 2018/0235085 A1 | 8/2018 | Huang |

OTHER PUBLICATIONS

Final Office Action for U.S. Appl. No. 16/814,729, issued Jan. 29, 2021, 9 pages.
Non-Final Office Action for U.S. Appl. No. 15/976,772, issued on Jan. 24, 2019, 13 pages.
Non-Final Office Action for U.S. Appl. No. 16/814,729, issued Aug. 5, 2020, 12 pages.
Non-Final Office Action for U.S. Appl. No. 17/397,842, issued Jan. 31, 2023, 10 pages.
Notice of Allowance for U.S. Appl. No. 15/976,772, issued Nov. 27, 2019, 8 pages.
Notice of Allowance for U.S. Appl. No. 16/814,729, issued Apr. 9, 2021, 8 pages.
Notice of Allowance for U.S. Appl. No. 17/397,842, issued May 22, 2023, 8 pages.

* cited by examiner

SUBSTRATE, SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 17/397,842 filed Aug. 9, 2021, which is a continuation of U.S. patent application Ser. No. 16/814,729 filed Mar. 10, 2020, now U.S. Pat. No. 11,088,061, which is a continuation of U.S. patent application Ser. No. 15/976,772 filed May 10, 2018, now U.S. Pat. No. 10,615,109, the contents of which are incorporated herein by reference in their entireties.

TECHNICAL FIELD

The present disclosure generally relates to a substrate, to a semiconductor device package, and to a method of manufacturing the same.

BACKGROUND

In a semiconductor device package, a conductive via may function as an electrical interconnection between different patterned conductive layers. A patterned conductive layer may have a conductive via and a via land. Size of a via land depends on size of a conductive via. Size of a via land may associate with layout (e.g. width, pitch etc.) of a patterned conductive layer. A via land may have a recess/dimple or protrusion resulted from manufacturing, which may adversely affect the structure (e.g. another conductive via) formed subsequently thereon. To address the above issue, the via land may be expanded to have a relatively flat or smooth surface to receive the structure formed on. However, such solution may increase the size of the semiconductor device package.

SUMMARY

In some embodiments, according to one aspect, a substrate includes a first dielectric layer having a first surface and a second dielectric layer having a first surface disposed adjacent to the first surface of the first dielectric layer. The substrate further includes a first conductive via disposed in the first dielectric layer and having a first end adjacent to the first surface of the first dielectric layer and a second end opposite the first end. The substrate further includes a second conductive via disposed in the second dielectric layer and having a first end adjacent to the first surface of the second dielectric layer. A width of the first end of the first conductive via is smaller than a width of the second end of the first conductive via, and a width of the first end of the second conductive via is smaller than the width of the first end of the first conductive via.

In some embodiments, according to another aspect, a device package includes a substrate and a die on the substrate. The substrate includes a first dielectric layer having a first surface and a second dielectric layer having a first surface disposed adjacent to the first surface of the first dielectric layer. The substrate further includes a first conductive via embedded in the first dielectric layer and having a first end adjacent to the first surface of the first dielectric layer and a second end opposite the first end, and a second conductive via embedded in the second dielectric layer and having a first end adjacent to the first surface of the second dielectric layer. A width of the first end of the first conductive via is smaller than a width of the second end of the first conductive via, and a width of the first end of the second conductive via is smaller than a width of the first end of the first conductive via.

In some embodiments, according to another aspect, a method for manufacturing a substrate includes providing a first dielectric layer having a first surface. The method further includes providing a first conductive via embedded in the first dielectric layer and having a first end adjacent to the first surface of the first dielectric layer and a second end opposite the first end, wherein a width of the first end of the first conductive via is smaller than a width of the second end of the first conductive via. The method further includes providing a second dielectric layer having a first surface adjacent to the first surface of the first dielectric layer. The method further includes removing a portion of the second dielectric layer to expose a portion of the first end of the first conductive via. The method further includes providing a second conductive via within the removed portion of the second dielectric layer and having a first end adjacent to the first surface of the second dielectric layer; wherein a width of the first end of the second conductive via is smaller than a width of the first end of the first conductive via.

BRIEF DESCRIPTION OF THE DRAWINGS

Aspects of the present disclosure are readily understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1A:
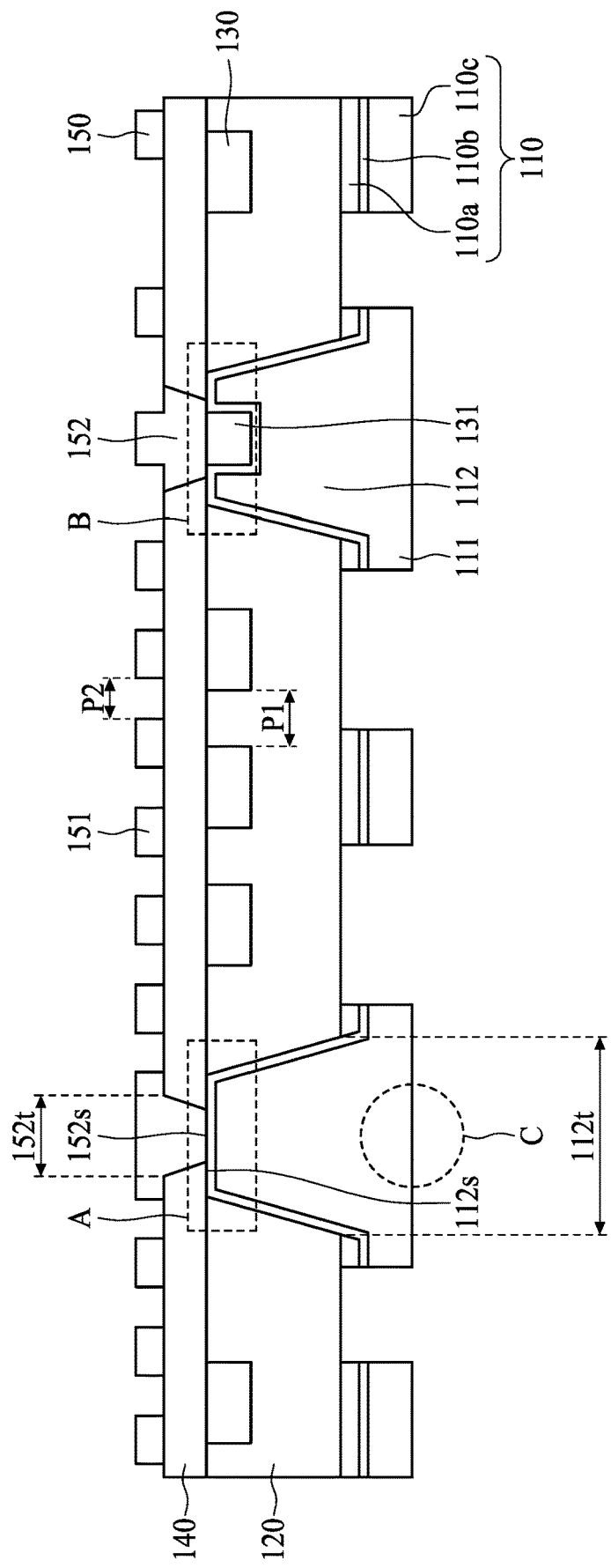
FIG. 1A is a schematic diagram illustrating a cross-sectional view of a substrate according to some embodiments of the present disclosure.

Embodiments of the present disclosure and use thereof are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and are not intended to be limiting.

Spatial descriptions, including such terms as "above," "below," "up," "left," "right," "down," "top," "bottom," "vertical," "horizontal," "side," "higher," "lower," "upper," "over," "under," and so forth, are used herein with respect to an orientation shown in corresponding figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed herein.

The present disclosure provides for a substrate, a semiconductor device package and a method for manufacturing the same. Embodiments of methods and structures described herein provide a relatively smaller via. A relatively smaller via can reduce the size of via land, and as a result the pitch of the patterned conductive layer formed can be reduced. An improved connection scheme provides better electrical connections in a semiconductor device package. Voids or cracks can be avoided at or close to the interface between two stacked vias.

FIG. 1A is a schematic diagram illustrating a cross-sectional view of a substrate according to some embodiments of the present disclosure. Referring to FIG. 1A, the substrate includes a dielectric layer 120, a dielectric layer 140, a patterned conductive layer 110 on one surface of the dielectric layer 120, a patterned conductive layer 130 embedded/buried in the dielectric layer 120, and a patterned conductive layer 150 on the dielectric layer 140.

Referring to FIG. 1A, the thickness of the dielectric layer 140 is smaller than that of the dielectric layer 120. The dielectric layer 120 may include, but are not limited to, molding compounds or pre-impregnated composite fibers (e.g., pre-preg). The dielectric layer 140 is similar or same to the dielectric layer 120. The dielectric layer 140 may be different from the dielectric layer 120 in other examples of the subject application. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

In some embodiments, the dielectric layer 120 includes polypropylene (PP) or Ajinomoto Build-up Film (ABF). In some embodiments, the dielectric layer 140 includes photosensitive dielectric materials. In some embodiments, the dielectric layer 140 includes polyimides (PI) or polyacrylate (PA).

The patterned conductive layer 110 is, or includes, a conductive material such as a metal or metal alloy. Examples include gold (Au), silver (Ag), aluminum (Al), copper (Cu), or an alloy thereof. In some embodiments, the patterned conductive layer 110 includes a conductive foil layer 110a, a seed layer 110b and a conductive layer 110c. In some embodiments, the substrate includes a conductive via 112 integrally formed with the conductive layer 110c. The conductive via 112 includes an end 112t and an end 112s opposite to the end 112t. In some embodiments, a width of the end 112t is greater than a width of the end 112s. In some embodiments, in the cross-sectional view, a portion of the conductive via 112 includes a trapezoid shape. In some embodiments, the patterned conductive layer 110 includes a via land 111 integrally formed with the conductive via 112.

In some embodiments, the substrate includes a trace 131 at least in part embedded in/surrounded by the conductive via 112. In some embodiments, the trace 131 is at least in part embedded in/surrounded by the seed layer 110b. Referring to FIG. 1A, the substrate further includes a conductive via 152 integrally formed with the patterned conductive layer 150. The dimension of the conductive via 152 is smaller compared to that of the conductive via 112.

Referring to FIG. 1A, the conductive via 152 includes an end 152*t* and an end 152*s* opposite to the surface 152*t*. In some embodiments, a width of the end 152*s* is greater than that of the trace 131. In some embodiments, a width of the end 152*t* is greater than a width of the end 152*s*. In some embodiments, in the cross-sectional view, a portion of the conductive via 152 includes a trapezoid shape.

The patterned conductive layers 130 and 150 are, or include, a conductive material such as a metal or metal alloy. Examples include gold (Au), silver (Ag), aluminum (Al), copper (Cu), or an alloy thereof. In some embodiments, the patterned conductive layer 130 includes a plurality of traces and/or pads. In some embodiments, pitch of the patterned conductive layer 130 is P1. In some embodiments, the patterned conductive layer 150 includes a plurality of traces and/or pads 151. In some embodiments, the pitch of the patterned conductive layer 150 is P2. In some embodiments, the pitch P1 is greater than the pitch P2. The dotted boxes A and B and the dotted circle C of FIG. 1A will be further discussed in subsequent paragraphs.

It should be noticed that, in the embodiment shown in FIG. 1A, there is no via land disposed at the interface between the dielectric layers 120 and 140. That is, the manufacturing of the patterned conductive layer 130 does not include forming a via land together with the patterned conductive layer 130. The elimination of via lands can thus reduce the pitch of the patterned conductive layer 130.

Figure 1D:
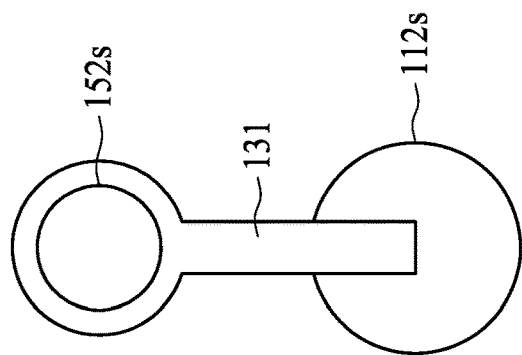
FIG. 1D is a schematic diagram illustrating a portion of a semiconductor package structure according to some embodiments of the present disclosure.
Figure 1C:
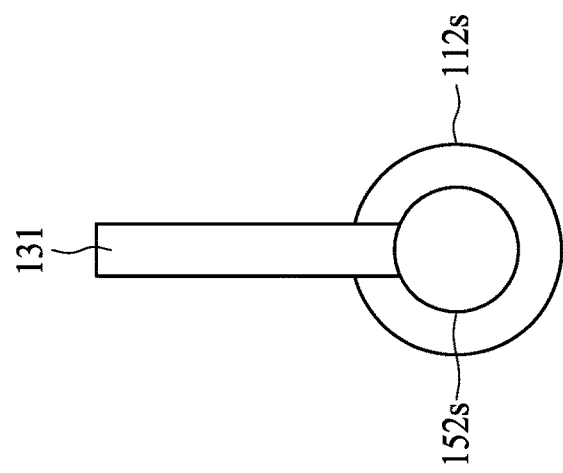
FIG. 1C is a schematic diagram illustrating a portion of a semiconductor package structure according to some embodiments of the present disclosure.
Figure 1B:
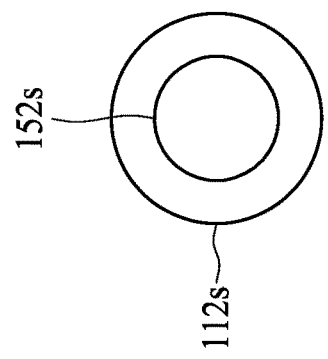
FIG. 1B is a schematic diagram illustrating a portion of a semiconductor package structure according to some embodiments of the present disclosure.

FIG. 1B is a schematic diagram illustrating a portion of a semiconductor package structure according to some embodiments of the present disclosure. FIG. 1B illustrates a top view of the structure in the dotted box A of FIG. 1A. Referring to FIG. 1B, the region occupied by the end 112*s* is greater than the region occupied by the end 152*s*, and the region occupied by the end 152*s* is within the region occupied by the end 112*s*.

FIG. 1C is a schematic diagram illustrating a portion of a semiconductor package structure according to some embodiments of the present disclosure. FIG. 1C illustrates a top view of an exemplary structure in the dotted box B of FIG. 1A. Referring to FIG. 1C, a portion of the trace 131 is sandwiched by the conductive via 112 and the conductive via 152, and a portion of the trace 131 extends beyond the end 112*s*. Referring to FIG. 1C, the region occupied by the end 112*s* is greater than the region occupied by the end 152*s*, and the region occupied by the end 152*s* is within the region occupied by the end 112*s*.

FIG. 1D is a schematic diagram illustrating a portion of a semiconductor package structure according to some embodiments of the present disclosure. FIG. 1D illustrates a top view of an exemplary structure in the dotted box B of FIG. 1A. Referring to FIG. 1D, the trace 131 forms a physical connection between the conductive via 112 and the conductive via 152. In some embodiments, the region occupied by the end 112*s* does not overlap with the region occupied by the end 152*s*.

Figure 1G:
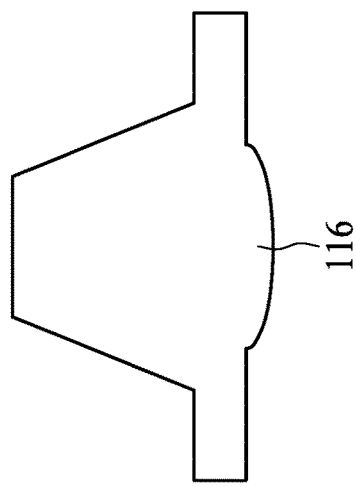
FIG. 1G is a schematic diagram illustrating a portion of a semiconductor package structure according to some embodiments of the present disclosure.
Figure 1F:
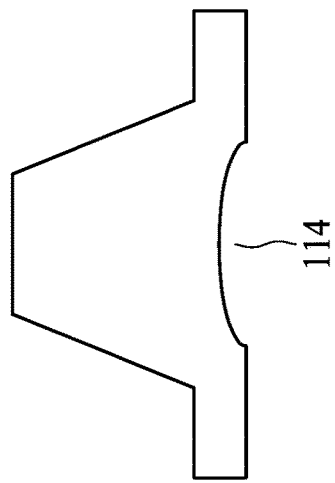
FIG. 1F is a schematic diagram illustrating a portion of a semiconductor package structure according to some embodiments of the present disclosure.
Figure 1E:
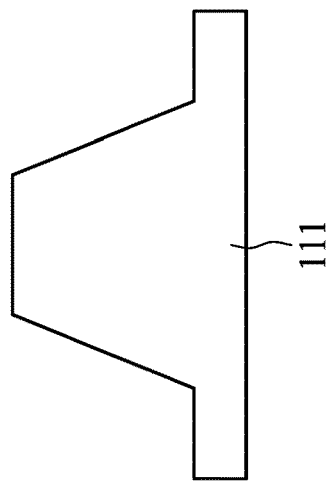
FIG. 1E is a schematic diagram illustrating a portion of a semiconductor package structure according to some embodiments of the present disclosure.

FIG. 1E is a schematic diagram illustrating a portion of a semiconductor package structure according to some embodiments of the present disclosure. FIG. 1E illustrates an exemplary structure in the dotted circle C of FIG. 1A. Referring to FIG. 1E, the via land 111 includes a substantial flat surface. FIG. 1F is a schematic diagram illustrating a portion of a semiconductor package structure according to some embodiments of the present disclosure. FIG. 1F illustrates an exemplary structure in the dotted circle C of FIG. 1A. Referring to FIG. 1F, the via land 111 includes a dimple/recess 144 resulted from manufacturing. FIG. 1G is a schematic diagram illustrating a portion of a semiconductor package structure according to some embodiments of the present disclosure. FIG. 1G illustrates an exemplary structure in the dotted circle C of FIG. 1A. Referring to FIG. 1G, the via land 111 includes a protrusion 116 resulted from manufacturing.

Figure 1H:
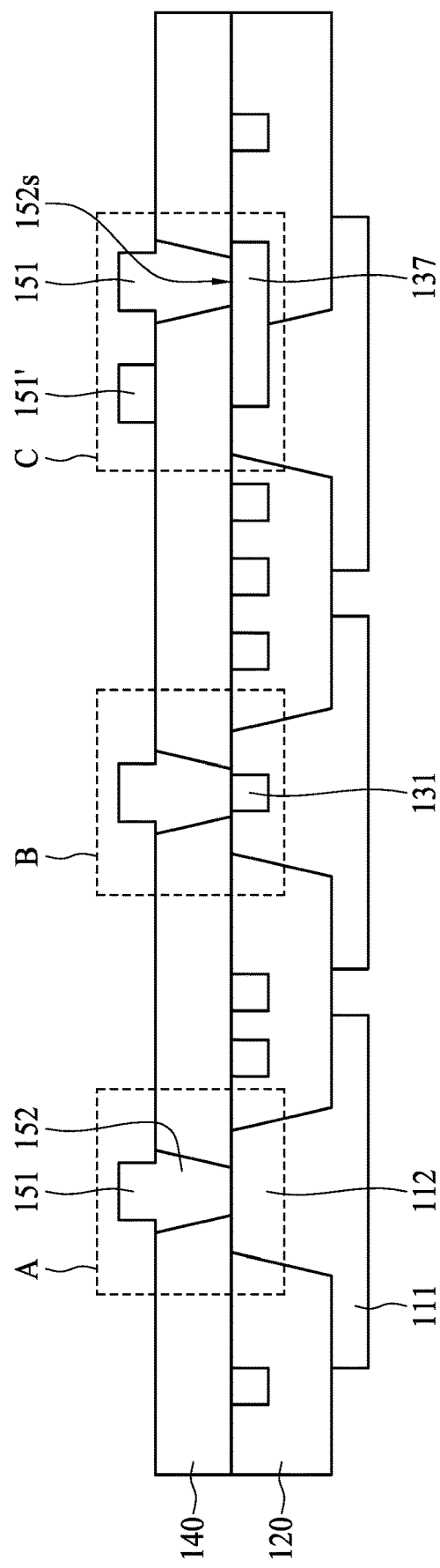
FIG. 1H is a schematic diagram illustrating a cross-sectional view of a substrate according to some embodiments of the present disclosure.

FIG. 1H is a schematic diagram illustrating a cross-sectional view of a substrate according to some embodiments of the present disclosure. Referring to FIG. 1H, the semiconductor package structure includes a dielectric layer 120, a dielectric layer 140 and a patterned conductive layer 130 embedded/buried in the dielectric layer 120. The dotted box A of FIG. 1H includes a conductive via 152 integrally formed with a trace 151 and stacked on a conductive via 112 integrally formed with a via land 111. The dotted box B of FIG. 1H includes a conductive via 152 integrally formed with a trace 151 and stacked on a conductive via 112 integrally formed with a via land 111. The dotted box B of FIG. 1H further includes a trace 131 at least in part embedded/surrounded by the conductive via 112. The dotted box C of FIG. 1H includes a conductive via 152 integrally formed with a trace 151 and stacked on a trace 137. The trace 137 is at least in part embedded/surrounded by the conductive via 112 and forms a connection between the conductive vias 112 and 152. The dotted boxes A, B and C of FIG. 1H will be further discussed in subsequent paragraphs.

Figure 1K:
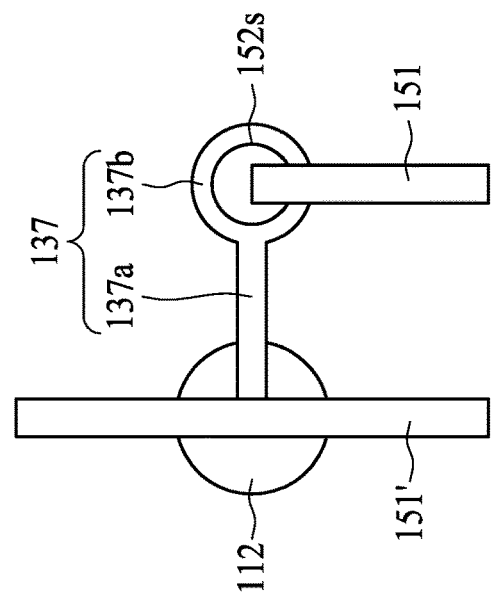
FIG. 1K is a schematic diagram illustrating a portion of a semiconductor package structure according to some embodiments of the present disclosure.
Figure 1J:
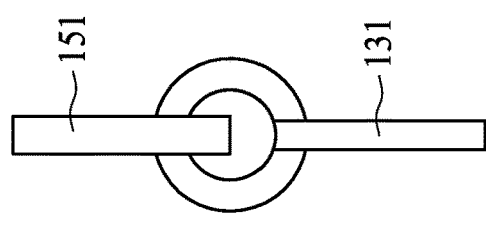
FIG. 1J is a schematic diagram illustrating a portion of a semiconductor package structure according to some embodiments of the present disclosure.
Figure 1I:
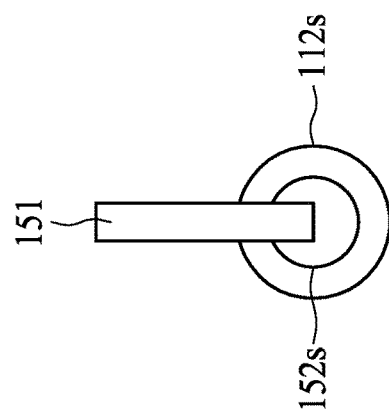
FIG. 1I is a schematic diagram illustrating a portion of a semiconductor package structure according to some embodiments of the present disclosure.

FIG. 1I is a schematic diagram illustrating a portion of a semiconductor package structure according to some embodiments of the present disclosure. FIG. 1I illustrates a top view of the structure in the dotted box A of FIG. 1H. Referring to FIG. 1I, the region occupied by the end 112*s* is greater than the region occupied by the end 152*s*, and the region occupied by the end 152*s* is within the region occupied by the end 112*s*. In some embodiment, one terminal of the trace 151 contacts the via 152 and the other terminal of the trace 151 extends to a first direction.

FIG. 1J is a schematic diagram illustrating a portion of a semiconductor package structure according to some embodiments of the present disclosure. FIG. 1J illustrates a top view of the structure in the dotted box B of FIG. 1H. In some embodiment, one terminal of the trace 131 contacts the vias 112 and 152 and the other terminal of the trace 131 extends to a first direction. In some embodiment, one terminal of the trace 151 contacts the via 152 and the other terminal of the trace 151 extends to a section direction.

FIG. 1K is a schematic diagram illustrating a portion of a semiconductor package structure according to some embodiments of the present disclosure. FIG. 1K illustrates a top view of the structure in the dotted box C of FIG. 1H. Referring to FIG. 1K, the trace 137 includes a portion 137*a* and a portion 137*b*. The area of the portion 137*b* is greater than the end 152*s* of the via 152. In some embodiments, the trace 137 connects between the via 112 and the via 152. In some embodiments, one terminal of the trace 151 contacts the conductive via 152 and the other terminal of the trace 151 extends to a first direction. In some embodiments, a trace 151' is disposed over the conductive via 112 and the portion 137*a* but does not contact the conductive via 112 and the portion 137*a*.

Figure 1L:
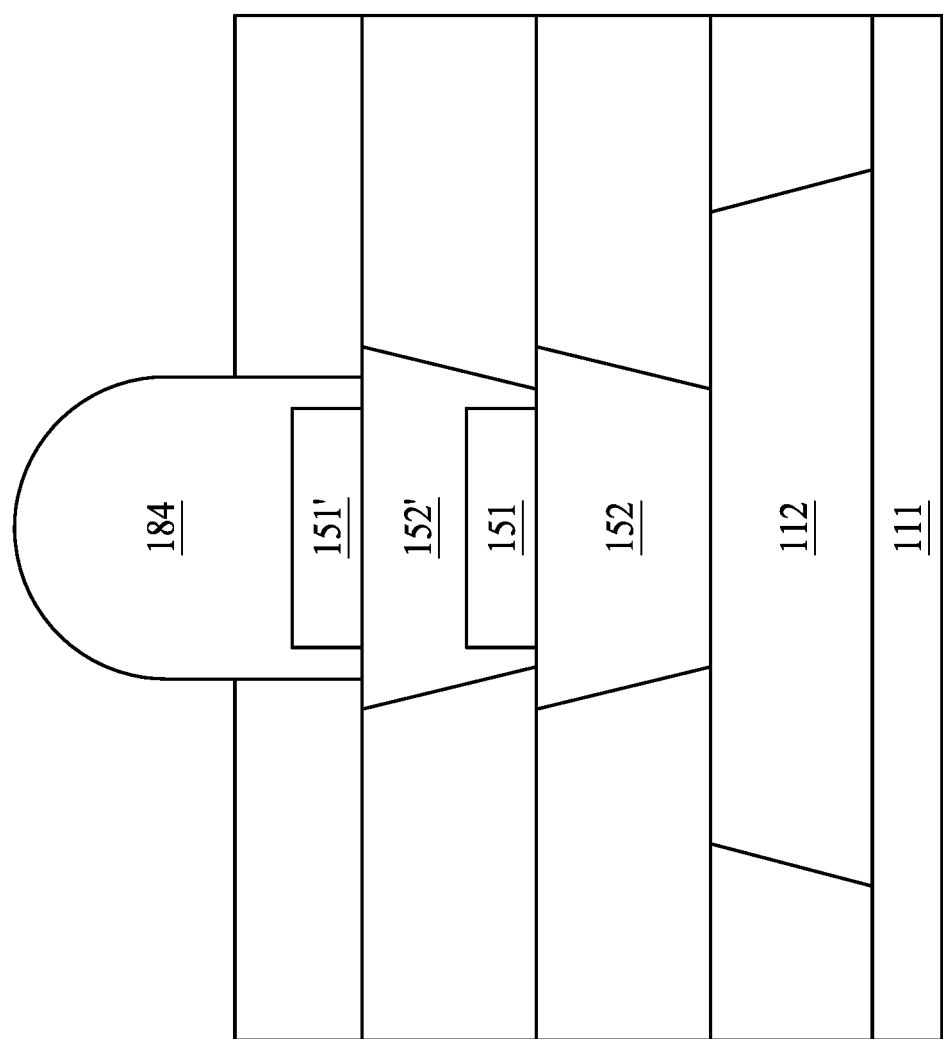
FIG. 1L is a schematic diagram illustrating a cross-sectional view of a substrate according to some embodiments of the present disclosure.

FIG. 1L is a schematic diagram illustrating a cross-sectional view of a substrate according to some embodiments of the present disclosure. Referring to FIG. 1L, the semiconductor package structure includes several dielectric layers, a via land 111, a conductive via 112, a conductive via 152, a trace 151, a conductive via 152', a trace 151' and an electrical connection element 184. In some embodiments, the via land 111 is integrally formed with the conductive 112. In some embodiments, the via land 111 is formed before or after the formation of the conductive 112. In some embodiments, the trace 151 is at least in part embedded/buried in the conductive via 152'. In some embodiments, the trace 151' is at least in part embedded/buried in the electrical connection element 184.

In some embodiments, in the cross-sectional view, the conductive vias 112, 152 and 152' each includes a trapezoid shape. In some embodiments, a width of the upper edge of the conductive via 152 is greater than a width of the bottom edge of the conductive via 152. In some embodiments, a width of the upper edge of the conductive via 152' is greater than a width of the bottom edge of the conductive via 152'. In some embodiments, a width of the upper edge of the conductive via 112 is smaller than a width of the bottom edge of the conductive via 112.

Figure 2C:
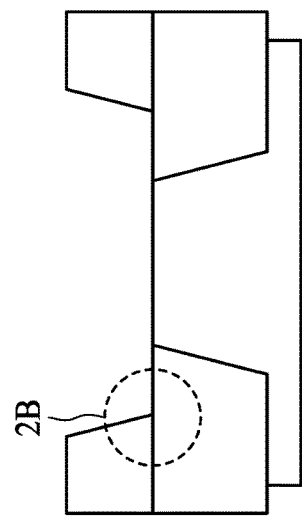
FIG. 2C is a schematic diagram illustrating a cross-sectional view of a substrate according to some embodiments of the present disclosure.
Figure 2B:
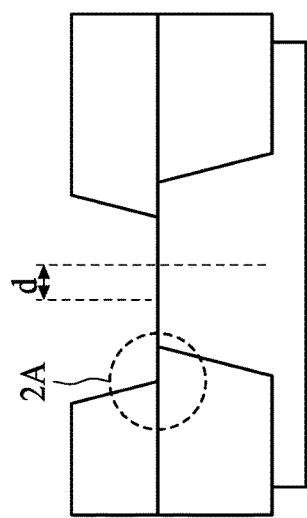
FIG. 2B is a schematic diagram illustrating a cross-sectional view of a substrate according to some embodiments of the present disclosure.
Figure 2A:
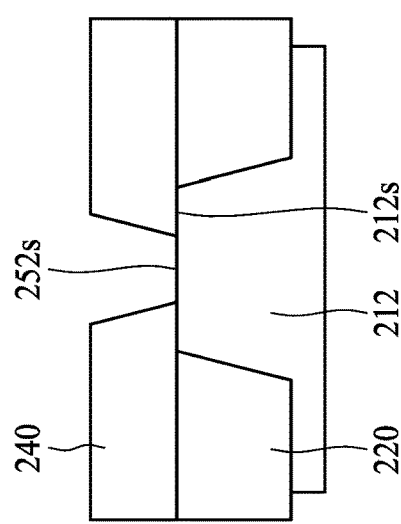
FIG. 2A is a schematic diagram illustrating a cross-sectional view of a substrate according to some embodiments of the present disclosure.

FIG. 2A is a schematic diagram illustrating a cross-sectional view of a substrate according to some embodiments of the present disclosure. The substrate includes a dielectric layer 220, a dielectric layer 240 and a conductive via 212. Referring to FIG. 2A, an opening is formed in the dielectric layer 240 before a conductive layer is formed. In some embodiments, the opening is formed using laser drill techniques. In some embodiments, the opening is formed using lithography techniques. In the embodiment shown in FIG. 2A, the width of the bottom surface 252s of the opening is smaller than that of the upper surface 212s of the conductive via 212.

Since the width of the bottom surface 252s of the opening is smaller than that of the upper surface 212s of the conductive via 212, during the formation of the opening, damages to the dielectric layer 220 near or around the upper surface 212s of the conductive via 212 can be avoided.

FIG. 2B is a schematic diagram illustrating a cross-sectional view of a substrate according to some embodiments of the present disclosure. In the embodiment shown in FIG. 2B, the width of the bottom surface 252s of the opening is substantially equal to that of the upper surface 212s of the conductive via 212. During the manufacturing of the opening, if the opening is not perfectly aligned with conductive via 212, the center of the opening will have a shift d with respect to the center of the conductive via 212. In this situation, during the formation of the opening, a portion of the dielectric layer 220 shown in the dotted circle 2A may be damaged during laser drill or lithography processes and may adversely affect the structure of the performance of the semiconductor substrate. For example, voids or cracks may be seen at or close to the interface between two dielectric layers.

FIG. 2C is a schematic diagram illustrating a cross-sectional view of a substrate according to some embodiments of the present disclosure. In the embodiment shown in FIG. 2C, the width of the bottom surface 252s of the opening is greater than that of the upper surface 212s of the conductive via 212. In this situation, in the formation of the opening, a portion of the dielectric layer 220 shown in the dotted circle 2B will easily be damaged during laser drill or lithography processes and may adversely affect the structure of the performance of the semiconductor substrate. For example, voids or cracks may be seen at or close to the interface between two dielectric layers.

FIG. 3A, FIG. 3B, FIG. 3C, FIG. 3D, FIG. 3E, FIG. 3F, FIG. 3G, FIG. 3H, FIG. 3I, FIG. 3K, FIG. 3L and FIG. 3M illustrate a method of manufacturing a substrate according to some embodiments of the present disclosure.

Figure 3A:
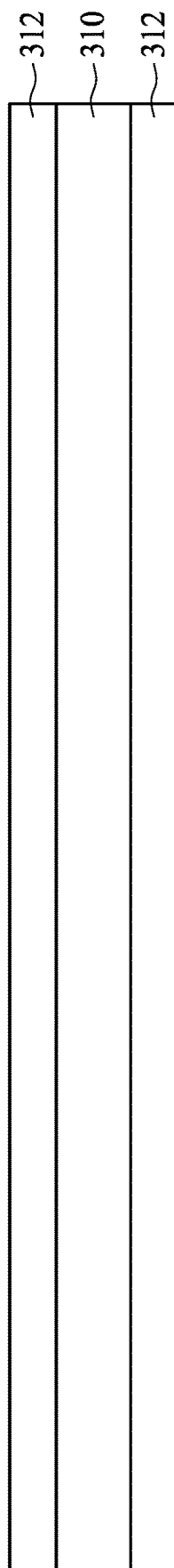
FIG. 3A, FIG. 3B, FIG. 3C, FIG. 3D, FIG. 3E, FIG. 3F, FIG. 3G, FIG. 3H, FIG. 3I, FIG. 3K, FIG. 3L and FIG. 3M illustrate a method of manufacturing a substrate according to some embodiments of the present disclosure.

Referring to FIG. 3A, a carrier 300 is provided, and conductive layers 312 are disposed on the surfaces of the carrier 300. The conductive layers 312 are, or include, a conductive material such as a metal or metal alloy. Examples include gold (Au), silver (Ag), aluminum (Al), copper (Cu), or an alloy thereof.

Figure 3B:
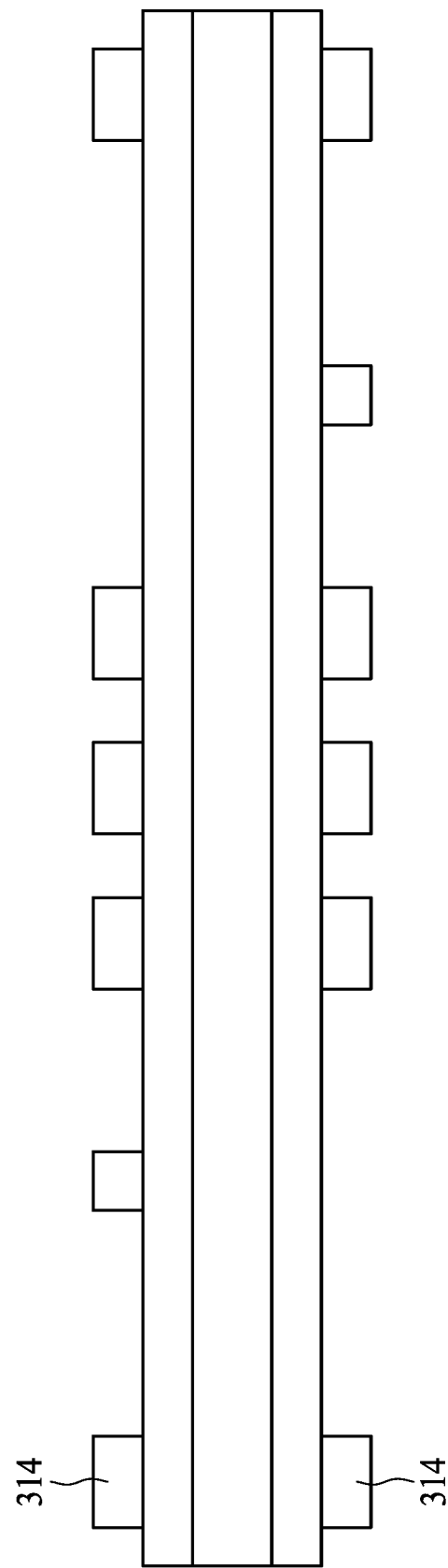

Referring to FIG. 3B, patterned layers 314 are formed on the conductive layers 312. In some embodiments, the patterned layers 314 are formed by a platting procedure. In some embodiments, the patterned layers 314 include conductive pads and/or conductive traces. The patterned layers 314 are, or include, a conductive material such as a metal or metal alloy. Examples include gold (Au), silver (Ag), aluminum (Al), copper (Cu), or an alloy thereof.

Figure 3C:
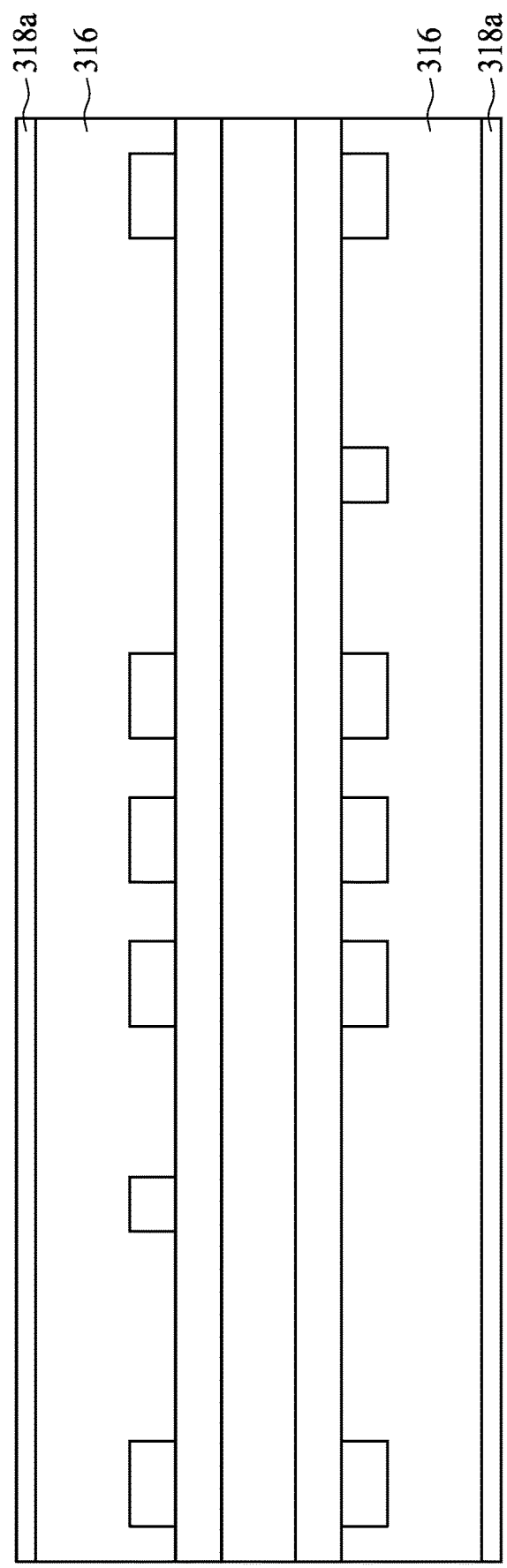

Referring to FIG. 3C, dielectric layers 316 are formed above the patterned layers 314 and encapsulating the patterned layers 314 and the conductive layers 312. Conductive foil layers 318a are formed on the dielectric layers 316. The conductive foil layers 318a may include conductive material such as copper (Cu), other conductive metals, an alloy, or other suitable material.

Figure 3D:
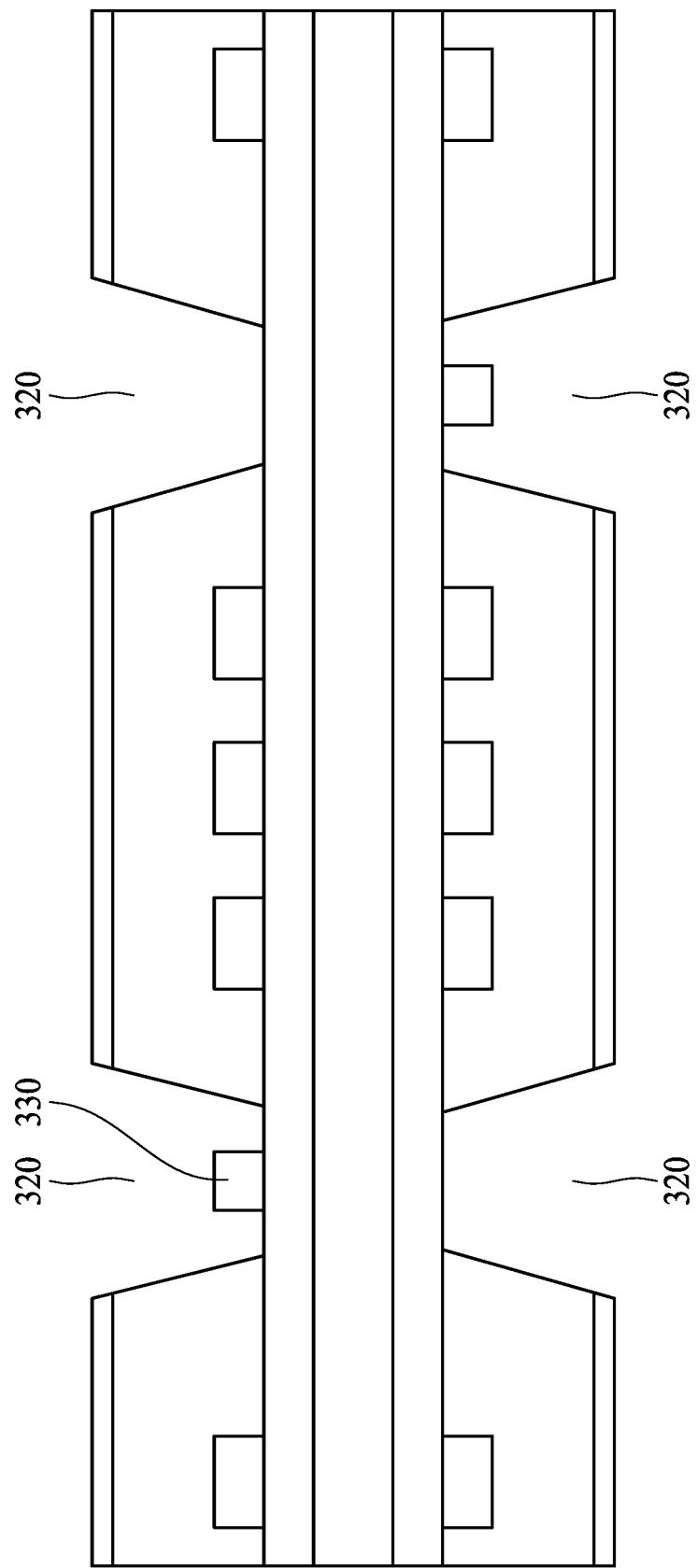

Referring to FIG. 3D, openings 320 are formed on the dielectric layers 316. Referring to FIG. 3D, a trace 330 is exposed by the opening 320. In some embodiments, the openings 320 are formed using laser drill techniques. In some embodiments, the openings 320 are formed using lithography techniques. In some embodiments, forming the openings 320 includes using negative photoresist.

Figure 3E:
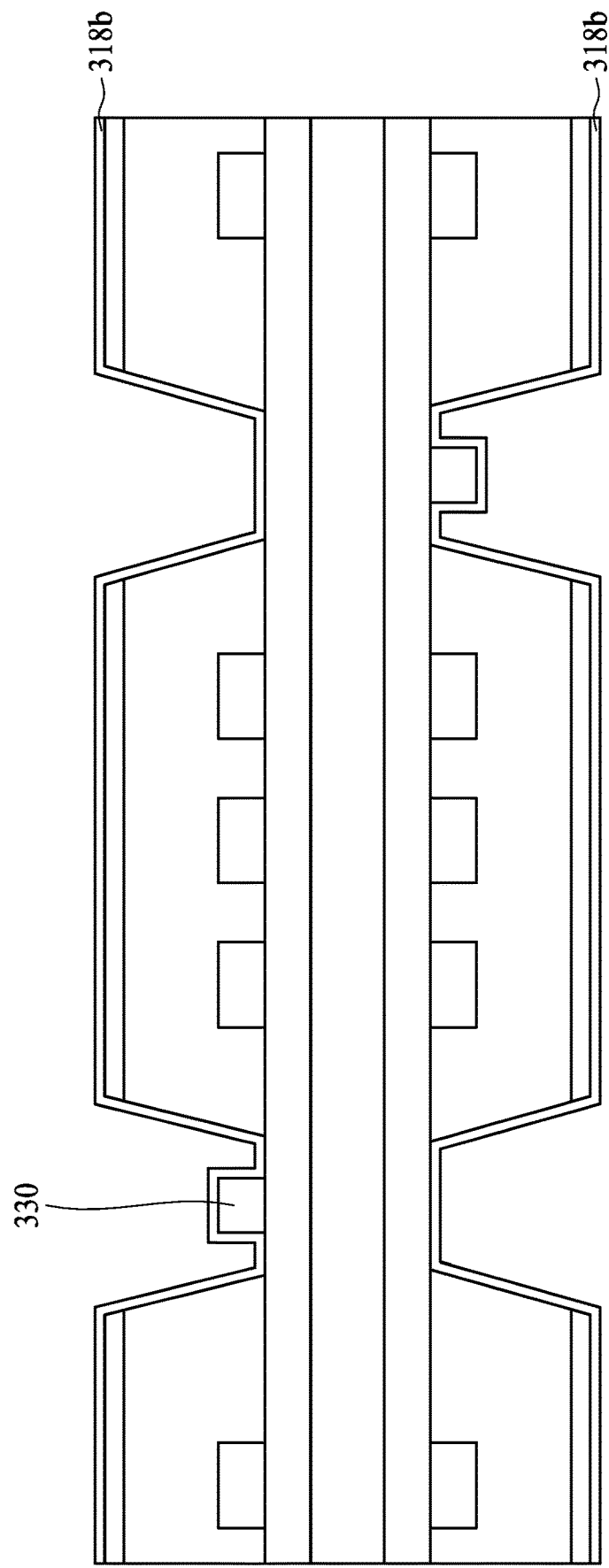

Referring to FIG. 3E, seed layers 318b are formed. The seed layers 318b are conformally formed above the conductive foil layer 318a, the dielectric layer 316, the trace 330 and the opening 312. Referring to FIG. 3E, the trace 330 is surrounded by the seed layer 318b.

Figure 3F:
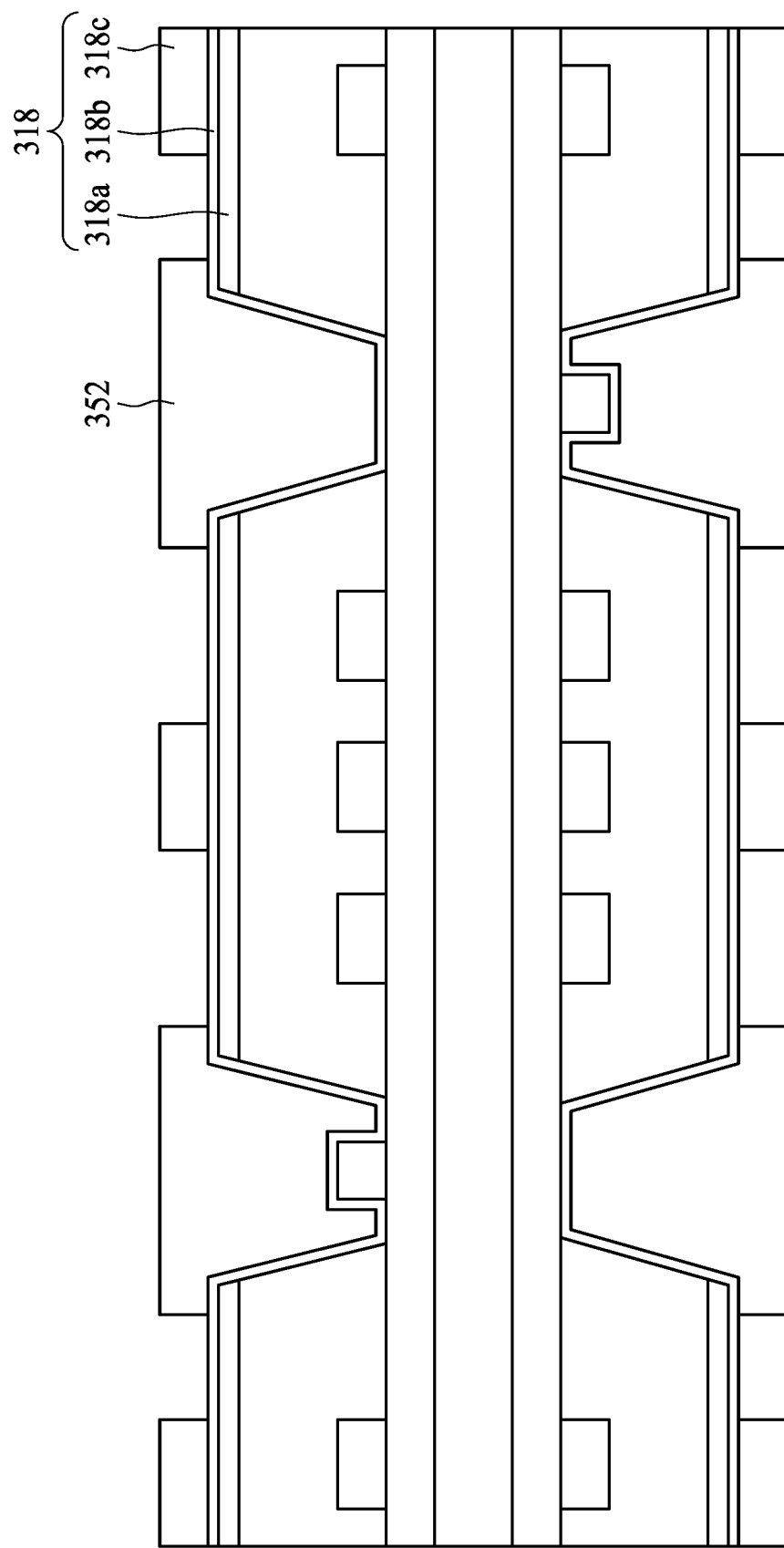

Referring to FIG. 3F, a metal deposition process is performed and a patterned conductive layer 318c is formed above the seed layer 318b. A conductive via 352 is integrally formed with the conductive layer 318c within the opening 320. The conductive foil layer 318a, the seed layer 318b and the conductive layer 318c will be referred to as conductive layer 318.

Figure 3G:
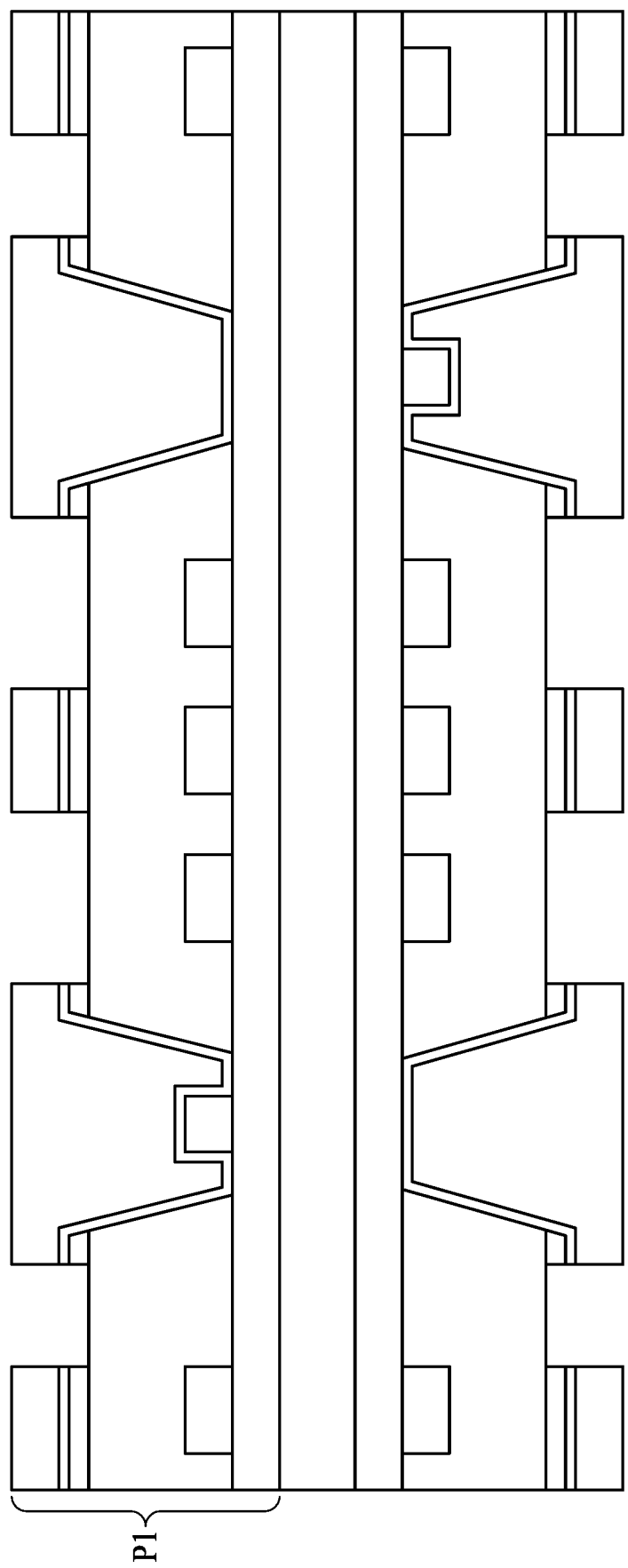

Referring to FIG. 3G, portions of the conductive foil layer 318a and the seed layer 318b are removed from the upper surface of the dielectric layer 316. In some embodiments, the portions of the conductive foil layer 318a and the seed layer 318b are removed using an etching technique.

Figure 3H:
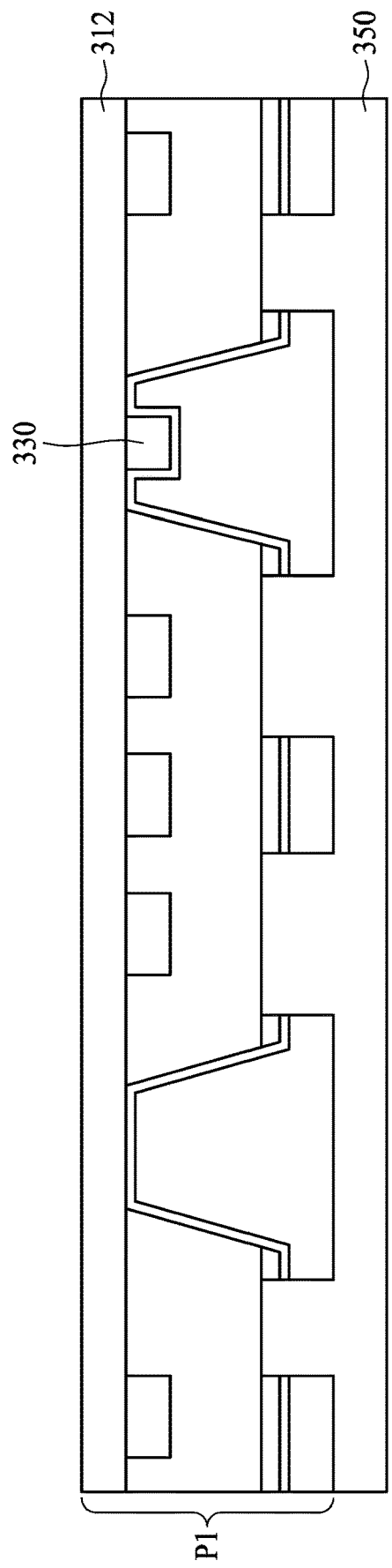

Referring to FIG. 3H, the package P1 is obtained by removing the carrier 300 of FIG. 3G. A protection layer 350 is formed on the dielectric layer 316 and encapsulates the conductive layer 318 and the conductive via 352.

Figure 3I:
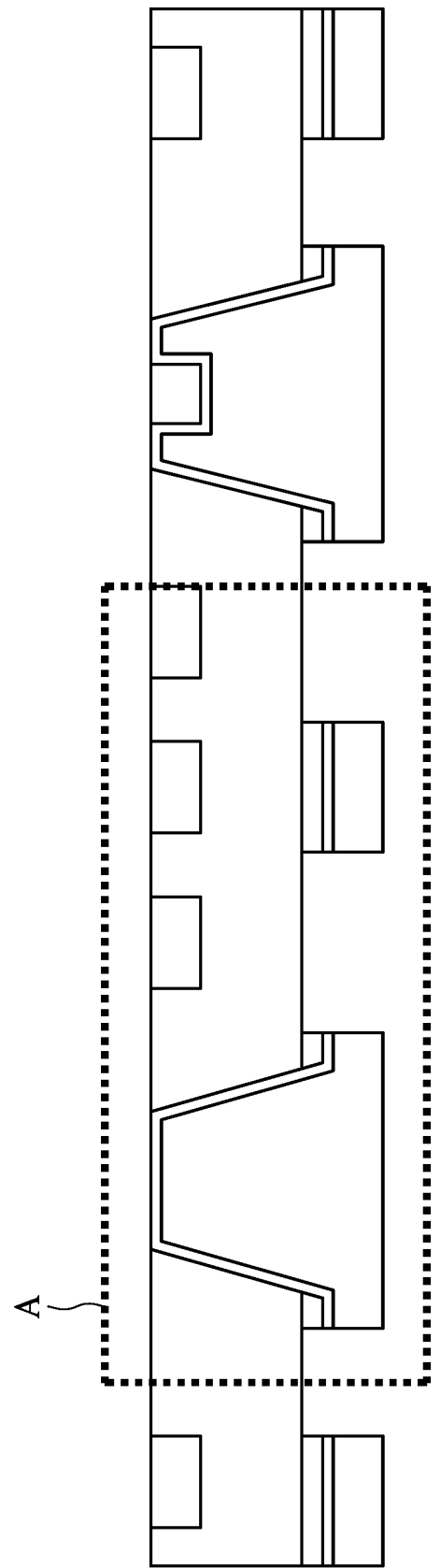

Referring to FIG. 3I, the conductive layer 312 is removed using an etching technique before the protection layer 350 is removed using a stripping process. The protection layer 350 can prevent the conductive layer 318 and the conductive via 352 from been damaged in the etching process.

Figure 3J:
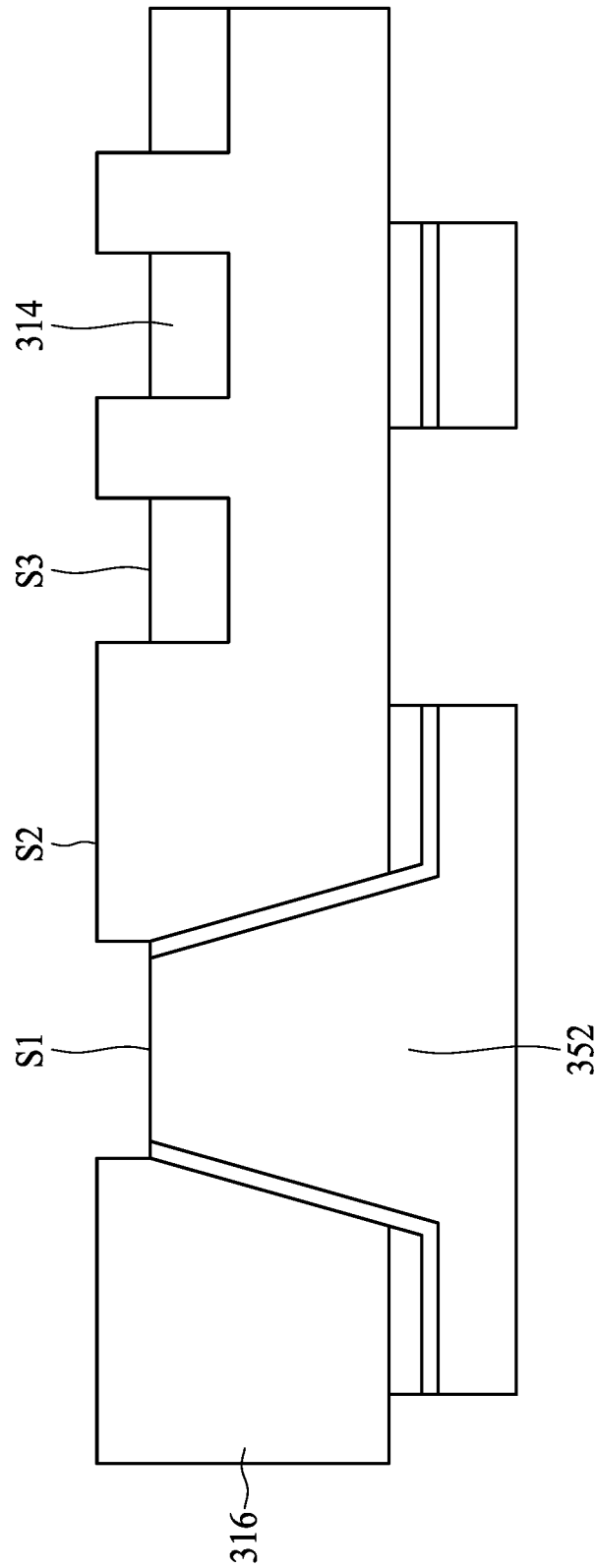
FIG. 3J is a schematic diagram illustrating a portion of the substrate in the dotted box A of FIG. 3I.

FIG. 3J is a schematic diagram illustrating a portion of the substrate in the dotted box A of FIG. 3I. The portion of the substrate includes a dielectric layer 316, a trace 314 and a conductive via 352. The conductive via 352 includes an upper surface S1. The dielectric layer 316 includes an upper surface S2. The trace 314 includes an upper surface S3. In some embodiments, the surface S1, S2 and S3 are substantially coplanar. In some embodiments, the surface S1, S2 and S3 are not coplanar. In some embodiments, the surface S1 and S3 are lower than the surface S2.

Figure 3K:
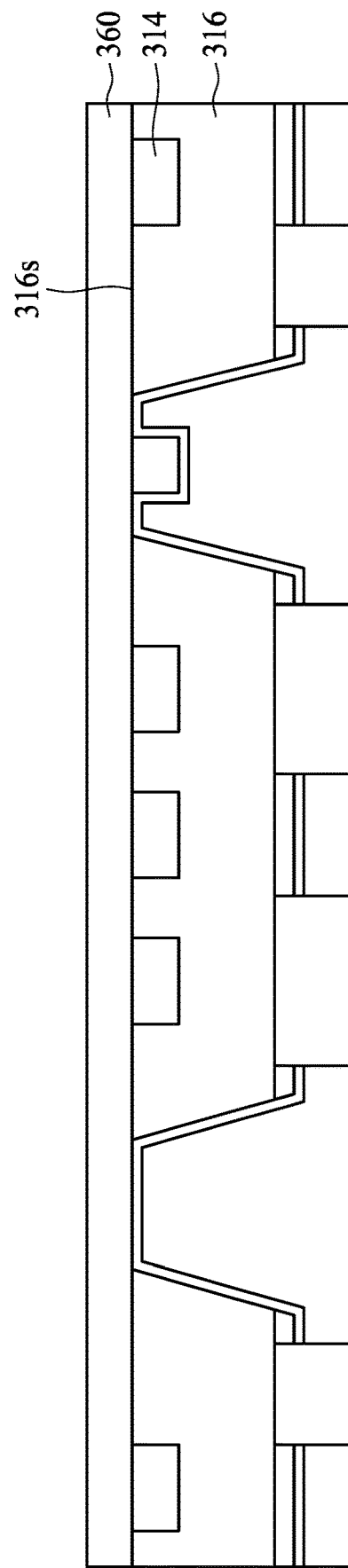

Referring to FIG. 3K, a dielectric layer 360 is formed on the dielectric layer 316. Since the upper surface 316s of the dielectric layer 316 is substantially flat (that is, the patterned conductive layer 314 is embedded/buried in the dielectric layer 316 instead of disposed on the dielectric layer 316), the thickness of the dielectric layer 360 can be reduced. Referring to FIG. 3K, the thickness of the dielectric layer 360 is smaller compared to that of the dielectric layer 316.

Figure 3L:
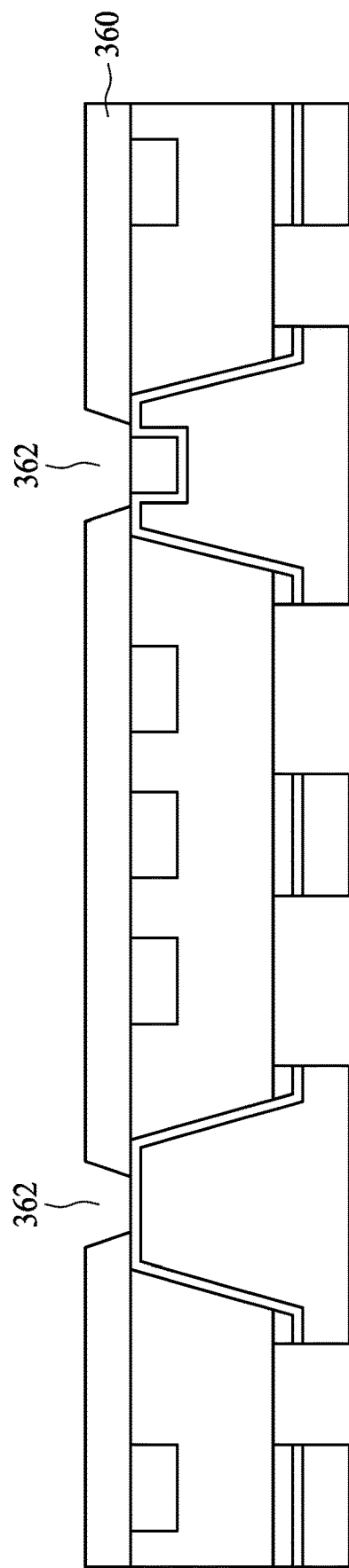

Referring to FIG. 3L, openings 362 are formed on the dielectric layer 316. In some embodiments, the openings 362 are formed using laser drill techniques. In some embodiments, the openings 362 are formed using lithography techniques. In some embodiments, forming the openings 362 includes using negative photoresist. In some embodiments, the opening 362 exposes a surface of the conductive via 352. In some embodiments, the opening 362 exposes a surface of the trace 330 and a portion of the conductive via 352.

As mentioned above, since the thickness of the dielectric layer 360 is smaller, the dimensions of the openings 362 can be reduced and thus the conductive via subsequently formed within the openings 362 can be reduced.

Figure 3M:
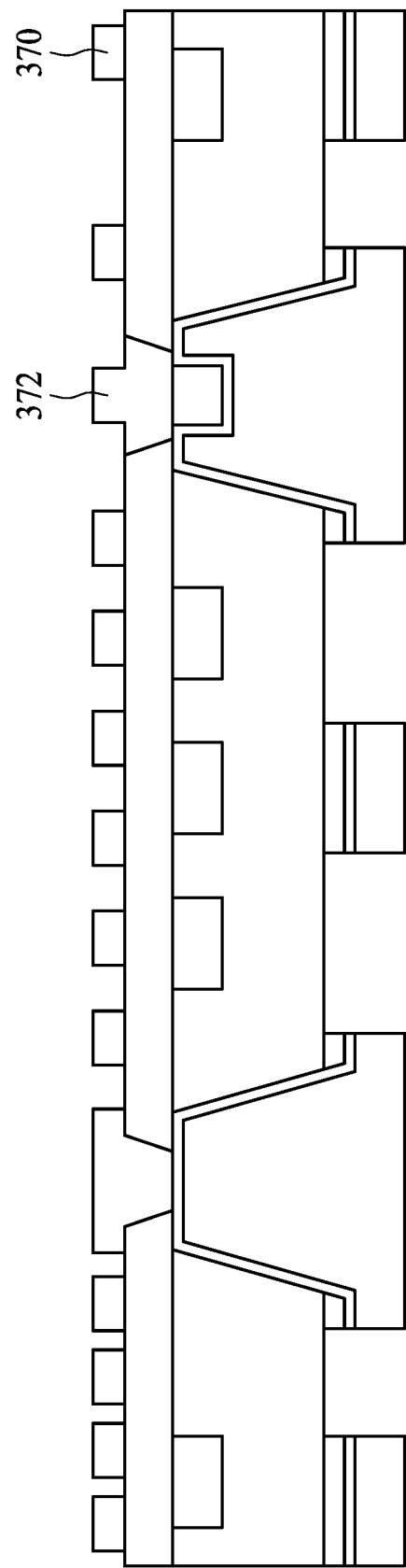

Referring to FIG. 3M, a metal deposition process is performed and a patterned conductive layer 370 is formed above the dielectric layer 360. A conductive via 372 is integrally formed with the conductive layer 370 within the opening 362. The substrate produced in FIG. 3M corresponds to that shown in FIG. 1A.

Figure 3N:
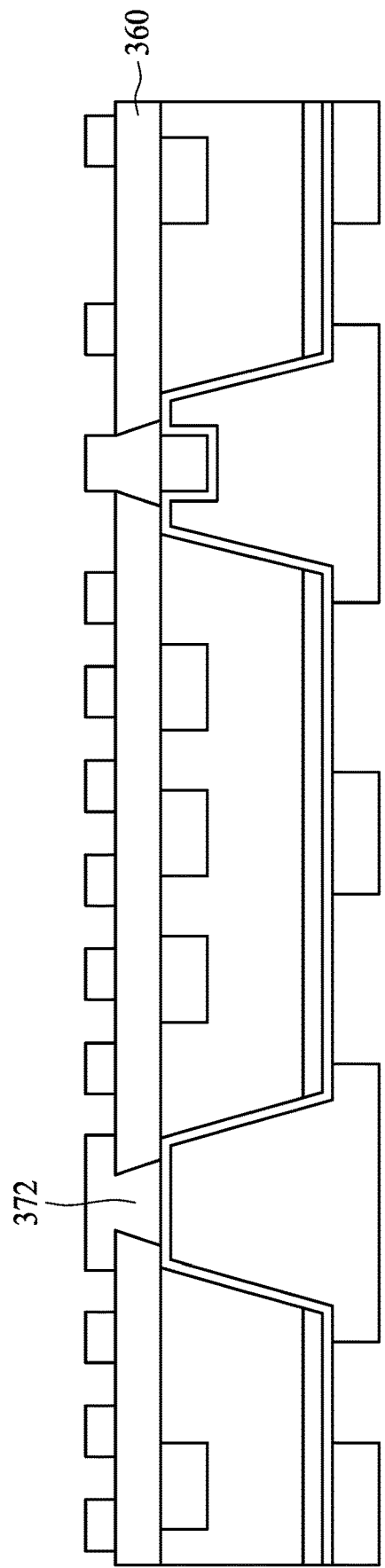
FIG. 3N illustrates a cross-sectional view of a substrate according to some embodiments of the present disclosure.

FIG. 3N illustrates a cross-sectional view of a substrate according to some embodiments of the present disclosure. The substrate shown in FIG. 3N is similar to that shown in FIG. 3M, except that in FIG. 3N, the opening 362 is formed using positive photoresist, and thus the shape of the conductive via 372 is different from that shown in FIG. 3M.

Figure 3O:
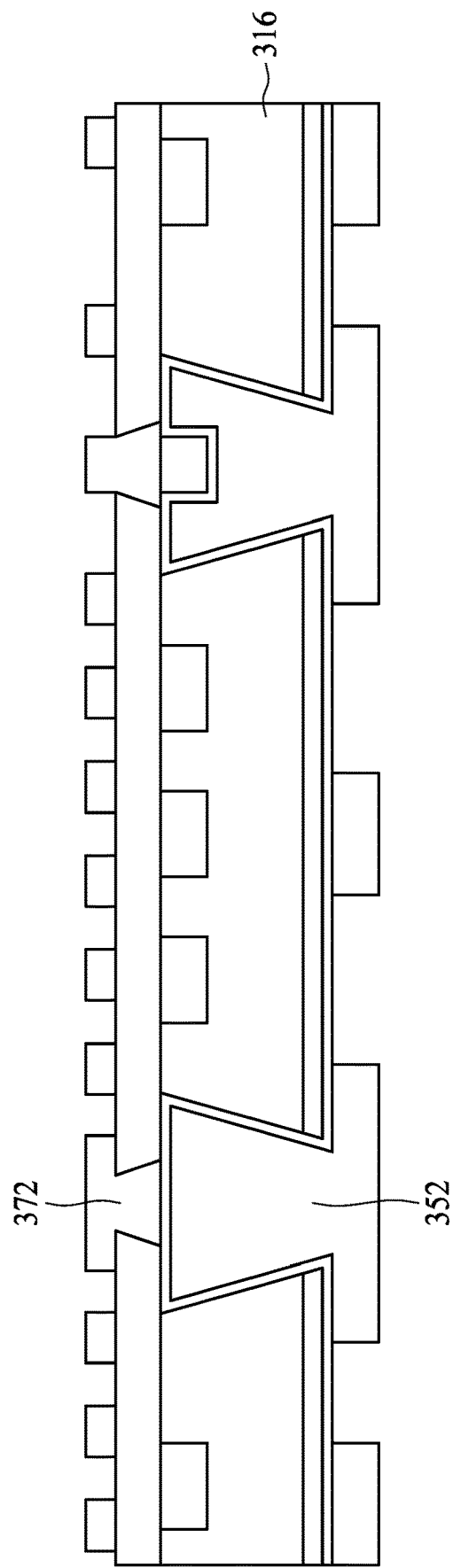
FIG. 3O illustrates a cross-sectional view of a substrate according to some embodiments of the present disclosure.

FIG. 3O illustrates a cross-sectional view of a substrate according to some embodiments of the present disclosure. The substrate shown in FIG. 3O is similar to that shown in FIG. 3M, except that in FIG. 3O, the openings 320 and 362 are formed using positive photoresist, and thus the shapes of the conductive vias 352 and 372 are different from that shown in FIG. 3M.

Figure 3P:
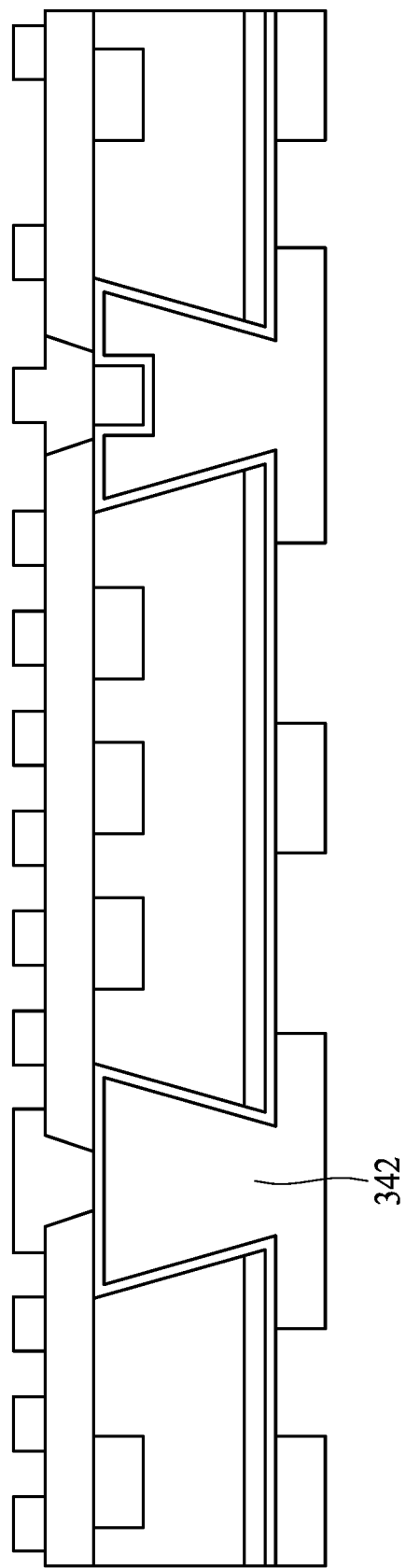
FIG. 3P illustrates a cross-sectional view of a substrate according to some embodiments of the present disclosure.

FIG. 3P illustrates a cross-sectional view of a substrate according to some embodiments of the present disclosure. The substrate shown in FIG. 3P is similar to that shown in FIG. 3M, except that in FIG. 3P, the opening 320 is formed using positive photoresist, and thus the shape of the conductive via 342 is different from that shown in FIG. 3M.

Figure 4:
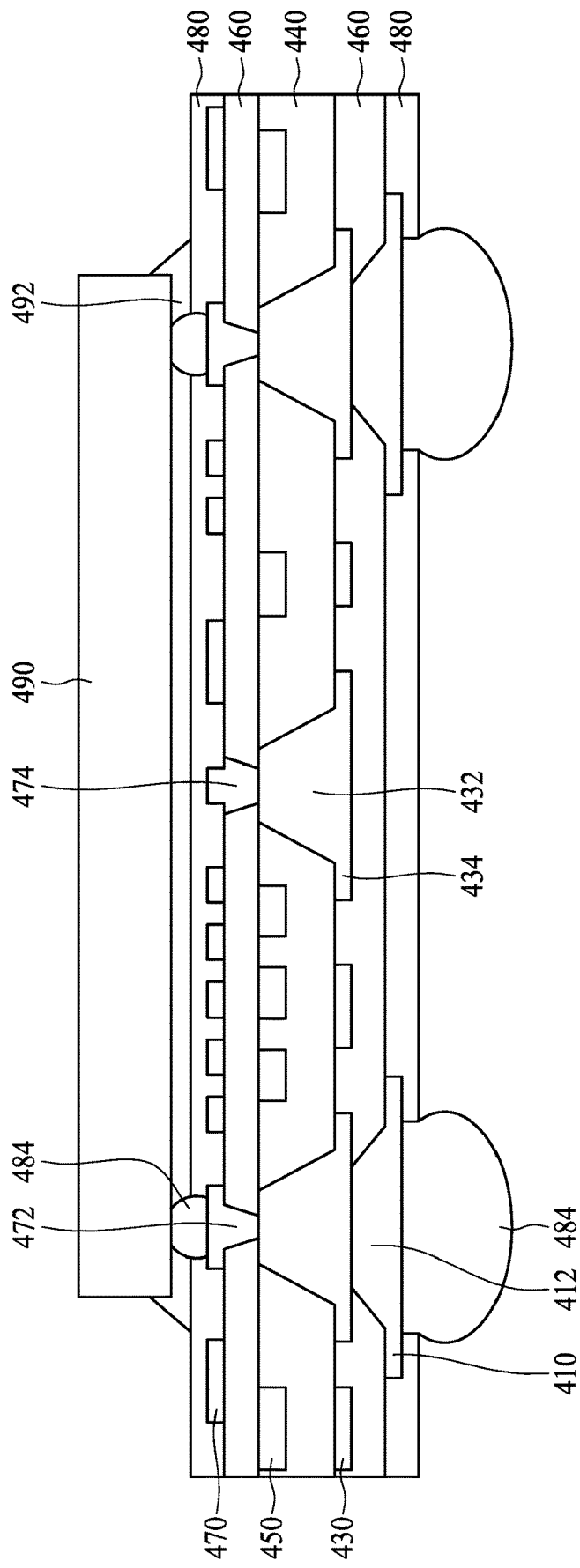
FIG. 4 is a schematic diagram illustrating a cross-sectional view of a semiconductor device package according to some embodiments of the present disclosure.

FIG. 4 is a schematic diagram illustrating a cross-sectional view of a semiconductor device package according to some embodiments of the present disclosure. The semiconductor device package shown in FIG. 4 includes dielectric layers 440, 460 and 480, patterned conductive layers 430, 450 and 470, conductive vias 412, 432, 472 and 474, electrical connection elements 484, an underfill layer 492 and a die 490. Referring to FIG. 4, the conductive via 412 includes a via land 410, and the conductive via 432 includes a via land 434. The patterned conductive layer 430 is embedded/buried in the dielectric layer 460. The patterned conductive layer 450 is embedded/buried in the dielectric layer 440. The patterned conductive layer 470 is embedded/buried in the dielectric layer 480.

The conductive via 432 is integrally formed with the patterned conductive layer 430. The conductive via 472 is integrally formed with the patterned conductive layer 470. The die 490 is electrically connected to the conductive via 472 through the electrical connection element 484. The underfill layer 492 is disposed between the die 490 and the dielectric layer 480. In some embodiments, the underfill 492 includes an epoxy resin, a molding compound (e.g., an epoxy molding compound or other molding compound), a polyimide, a phenolic compound or material, a material including a silicone dispersed therein, or a combination thereof.

FIG. 4A, FIG. 4B, FIG. 4C, FIG. 4D and FIG. 4E illustrate a method of manufacturing a semiconductor device package according to some embodiments of the present disclosure.

Figure 4A:
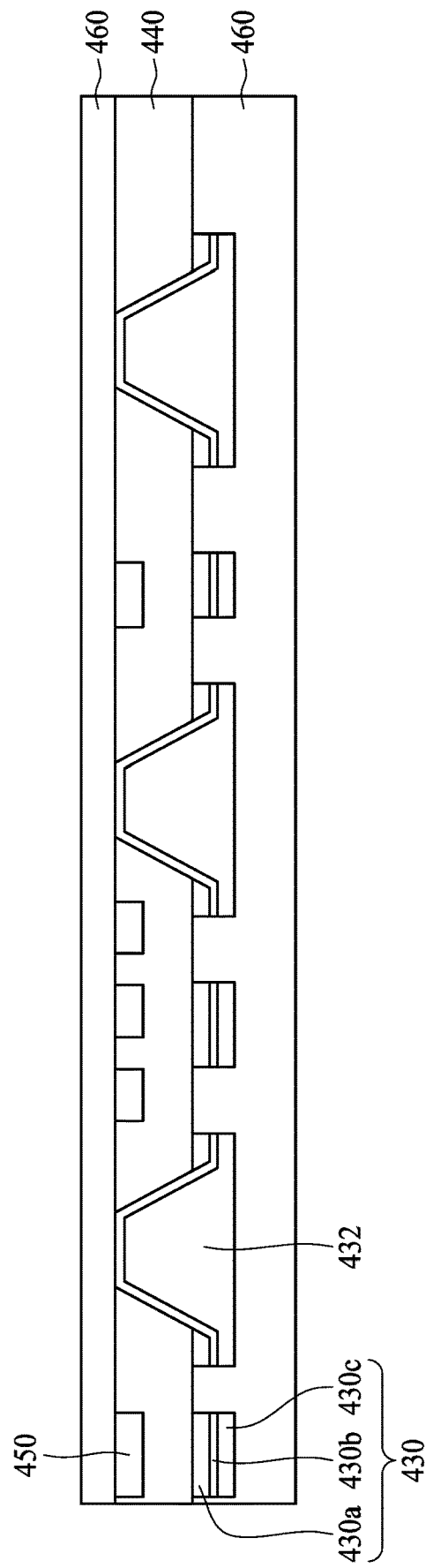
FIG. 4A, FIG. 4B, FIG. 4C, FIG. 4D and FIG. 4E illustrate a method of manufacturing a semiconductor device package according to some embodiments of the present disclosure.

Referring to FIG. 4A, a substrate is provided. The substrate includes dielectric layers 440 and 460, patterned conductive layers 430 and 450 and conductive vias 432. The patterned conductive layer 430 includes a conductive foil layer 430a, a seed layer 430b and a conductive layer 430c.

Figure 4B:
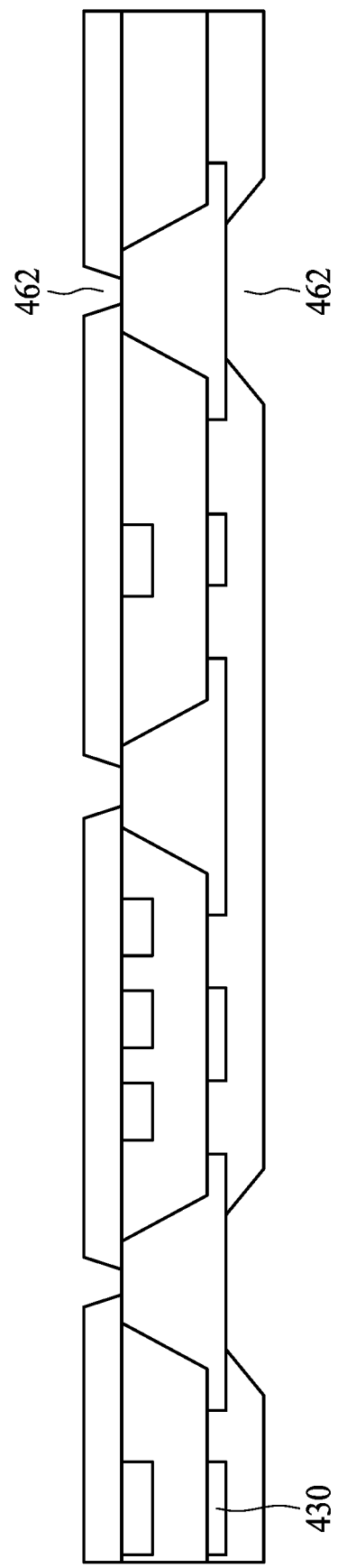

Referring to FIG. 4B, openings 462 are formed in the dielectric layers 460. In some embodiments, the openings 462 are formed using laser drill techniques. In some embodiments, the openings 462 are formed using lithography techniques. In FIG. 4B, the patterned conductive layer 430 is plotted as a single layer for sake of simplicity.

Figure 4C:
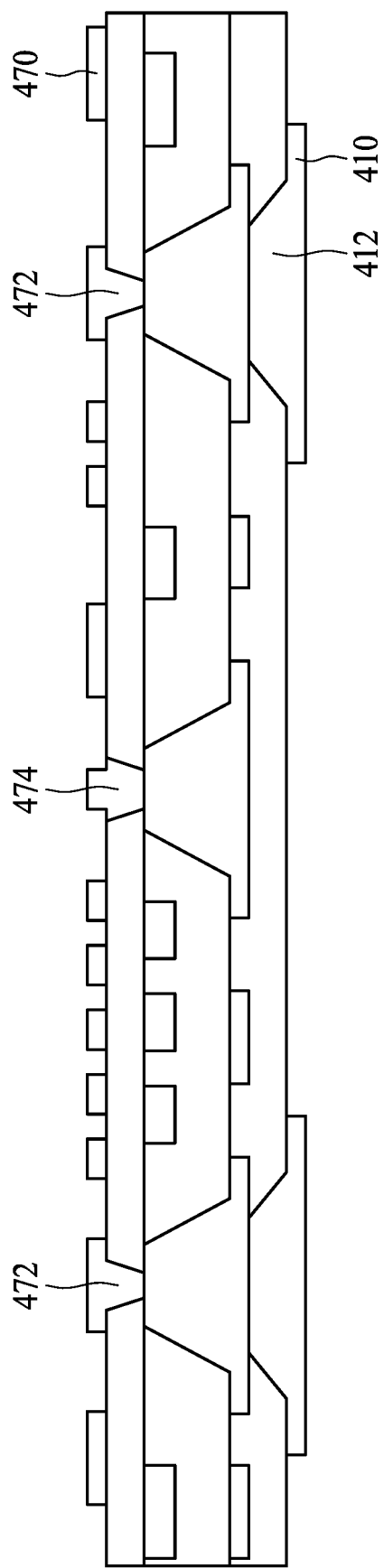

Referring to FIG. 4C, a metal deposition process is performed to form a conductive via 412. The conductive via 412 includes a via land 410. A metal deposition process is performed to form a patterned conductive layer 470. Conductive vias 472 and 474 are integrally formed with the conductive layer 470 within the opening 462. In some embodiments, the conductive via 472 include a via land on the top of the conductive via 472. In some embodiments, the conductive via 474 include a trace on the top of the conductive via 474.

Figure 4D:
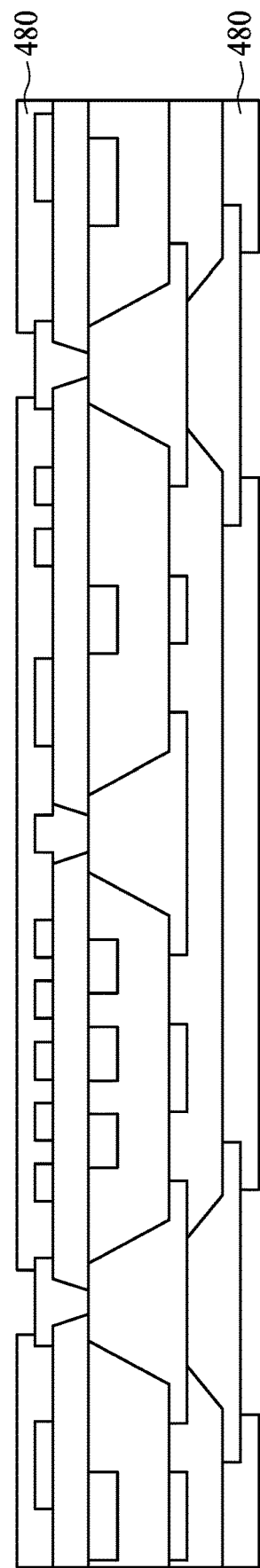

Referring to FIG. 4D, dielectric layers 480 are formed on the dielectric layers 460. Portions of the dielectric layers 480 are removed so as to expose a surface of the conductive vias 412 and 472.

Figure 4E:
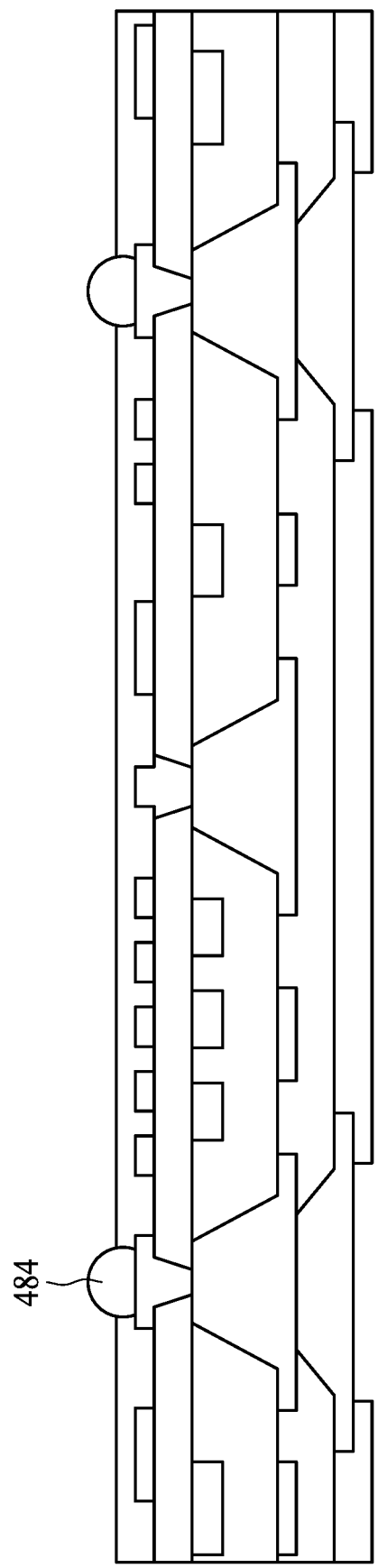

Referring to FIG. 4E, electrical connection elements 484 are disposed on the conductive vias 472. The electrical connection elements 484 will then used as the connection between the conductive vias 472 and a die 490.

Figure 5A:
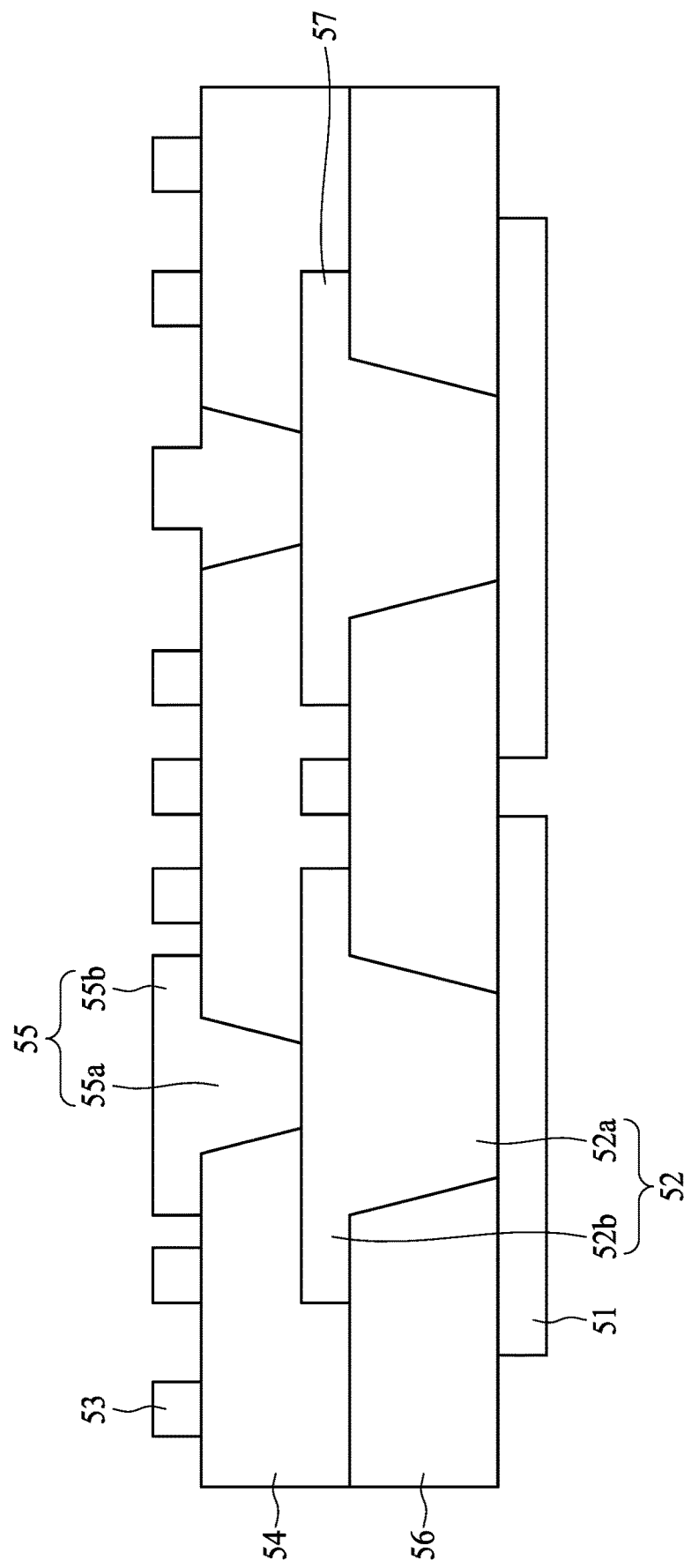
FIG. 5A is a schematic diagram illustrating a cross-sectional view of a substrate according to some embodiments of the present disclosure.

FIG. 5A is a schematic diagram illustrating a cross-sectional view of a substrate according to some embodiments of the present disclosure. The substrate includes dielectric layers 54 and 56, patterned conducive layers 51, 53 and 57 and conductive vias 52 and 55. The conductive via 52 includes a portion 52a and a portion 52b. The conductive via 55 includes a portion 55a and a portion 55b. Referring to FIG. 5A, the portion 52b includes a substantial flat surface and the conductive via 55 is stacked on the conductive via 52. In some embodiments, the portion 52b is a via land. The existence of the portion 52b will adversely affect the layout (e.g. width, pitch etc.) of the patterned conductive layer 57.

Figure 5B:
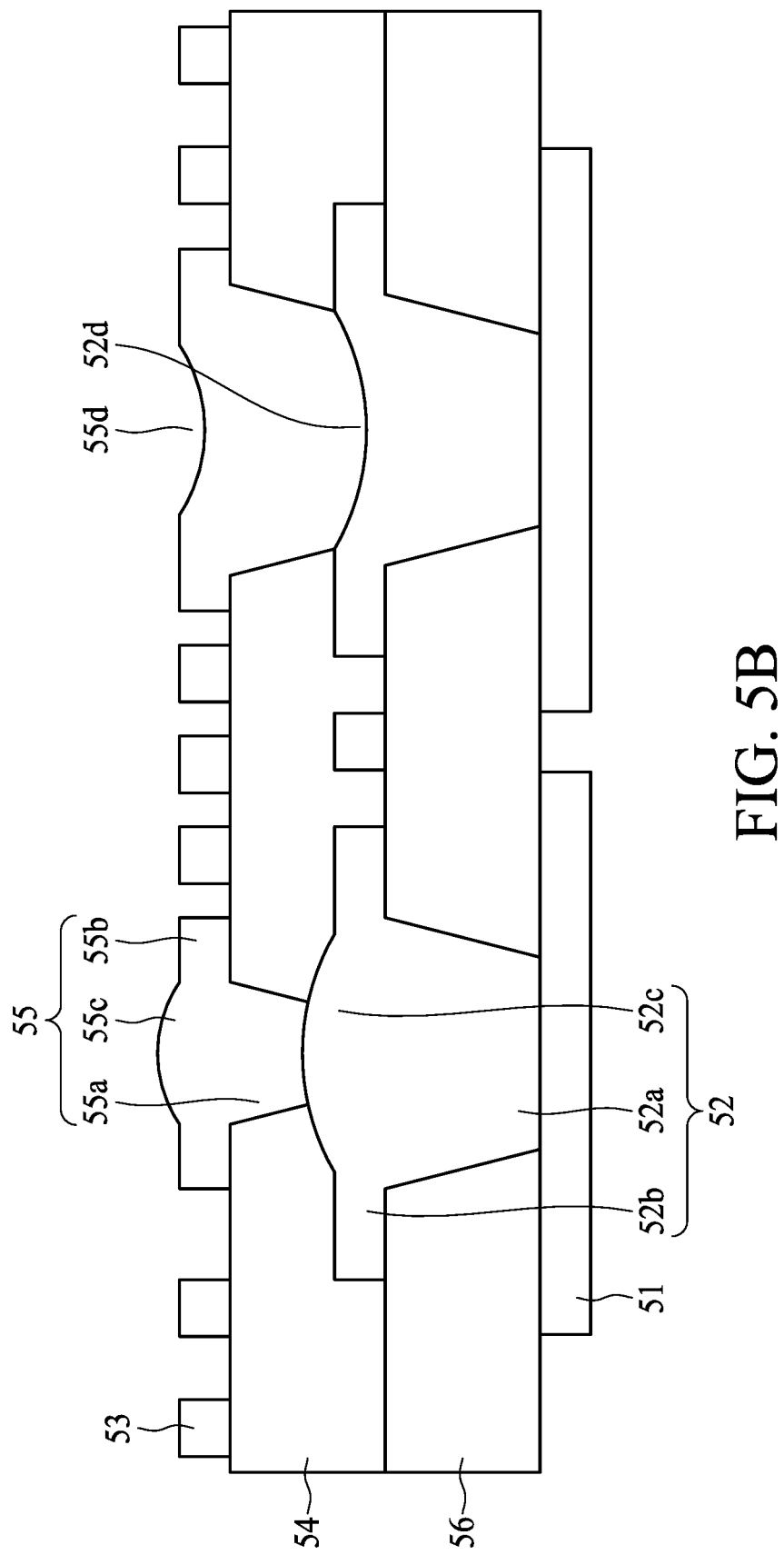
FIG. 5B is a schematic diagram illustrating a cross-sectional view of a substrate according to some embodiments of the present disclosure.

FIG. 5B is a schematic diagram illustrating a cross-sectional view of a substrate according to some embodiments of the present disclosure. The substrate includes dielectric layers 54 and 56, patterned conducive layers 51 and 53 and conductive vias 52 and 55. In some embodiments, the conductive via 52 includes a portion 52a, a portion 52b and a portion 52c. The conductive via 55 includes a portion 55a, a portion 55b and a portion 55c. The portion 52c is a protrusion resulted from manufacturing, which may adversely affect the structure formed subsequently thereon. For example, the conductive via 55 formed subsequently on the conductive via 52 will inevitably include a protrusion portion 55c.

In some embodiments, the conductive via 52 includes a recess/dimple portion 52d resulted from manufacturing, which may adversely affect the structure formed subsequently thereon. For example, the conductive via 55 formed subsequently on the conductive via 52 will inevitably include a recess/dimple portion 55d.

Figure 5C:
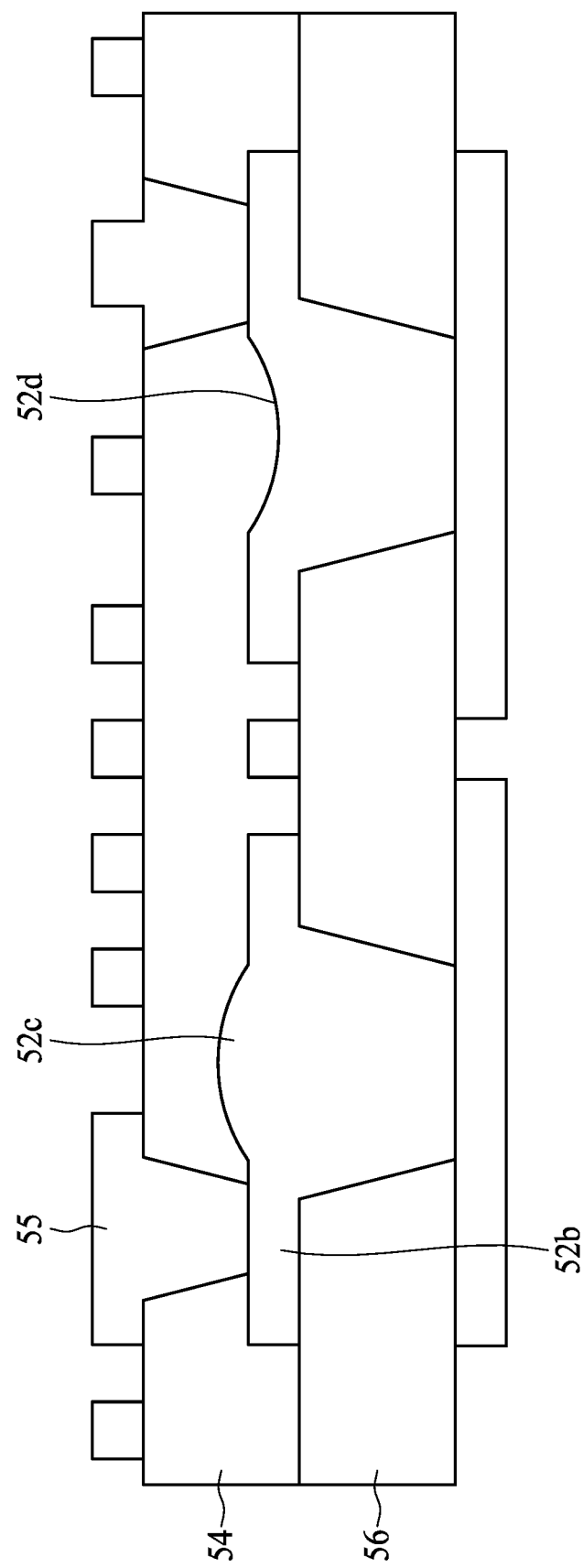
FIG. 5C is a schematic diagram illustrating a cross-sectional view of a substrate according to some embodiments of the present disclosure.

FIG. 5C is a schematic diagram illustrating a cross-sectional view of a substrate according to some embodiments of the present disclosure. In the embodiment shown in FIG. 5C, the conductive via 52 includes a protrusion portion 52c or a recess/dimple portion 52d resulted from manufacturing. In order to avoid the recess/dimple portion or protrusion portion formed on the conductive via 55, the position of the conductive via 55 should be shifted. In some embodiments, the conductive via 55 will be disposed on the portion 52b. In some embodiments, the portion 52b is a via land. The existence of the portion 52b will adversely affect the layout (e.g. width, pitch etc.) of the patterned conductive layer formed between the dielectric layers 54 and 56.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "substantially," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "about" or "substantially" equal in reference to two values can refer to a ratio of the two values being within a range between and inclusive of 0.9 and 1.1

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure, as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a lower conductive structure comprising a core substrate; and
   an upper conductive structure over the lower conductive structure, wherein the upper conductive structure comprises a first via having a width substantially increasing towards the lower conductive structure, and the lower conductive structure comprises a second via having a width substantially increasing towards the upper conductive structure; and
   a conductive layer between the first via and the second via.

2. The package structure as claimed in claim 1, further comprising a dielectric layer laterally covering the conductive layer.

3. The package structure as claimed in claim 2, wherein a portion of the dielectric layer vertically overlaps the second via.

4. The package structure as claimed in claim 2, wherein the dielectric layer is spaced apart from the first via.

5. The package structure as claimed in claim 1, further comprising a conductive element between the first via and the conductive layer.

6. The package structure as claimed in claim 1, wherein the lower conductive structure comprises a low-density conductive structure, and the upper conductive structure comprises a high-density conductive structure.

7. The package structure as claimed in claim 6, wherein the high-density conductive structure comprises a patterned conductive layer having a first pitch, and the low-density conductive structure comprises a patterned conductive layer having a second pitch greater than the first pitch.

8. The package structure as claimed in claim 6, wherein the high-density conductive structure comprises a patterned conductive layer having a first thickness, and the low-density conductive structure comprises a patterned conductive layer having a second thickness greater than the first thickness.

9. A package structure, comprising:
   a first conductive structure comprising a first dielectric layer having a first opening, wherein the first opening has a first wider portion and a first narrower portion; and
   an second conductive structure over the first conductive structure, the second conductive structure comprising a second dielectric layer having a second opening, wherein the second opening has a second wider portion and a second narrower portion;
   wherein the first wider portion faces to the second wider portion, and the first narrower portion faces away from the second wider portion;
   wherein the second wider portion of the second opening is smaller than the first wider portion of the first opening; and
   wherein the second conductive structure comprises a patterned conductive layer including a first pattern, a second pattern, and a third pattern, the second pattern is adjacent to the first pattern and the third pattern, and a distance between the first pattern and the second pattern is different from a distance between the second pattern and the third pattern.

10. The package structure as claimed in claim 9, wherein the patterned conductive layer of the second conductive structure has a first line width, and the first conductive structure comprises a patterned conductive layer having a second line width greater than the first line width.

11. The package structure as claimed in claim 9, wherein the patterned conductive layer of the second conductive structure has a first line spacing, and the first conductive structure comprises a patterned conductive layer having a second line spacing greater than the first line spacing.

12. The package structure as claimed in claim 9, wherein a width of the second wider portion of the second opening is smaller than a width of the first narrower portion of the first opening.

13. The package structure as claimed in claim 9, wherein a top surface of the second dielectric layer faces away from the first conductive structure and is a substantially flat surface.

14. A substrate structure, comprising:
- a low-density conductive structure; and
- a high-density conductive structure over the low-density conductive structure, comprising:
  - a dielectric layer having a surface facing the low-density conductive structure;
  - a first via comprising a first portion in the dielectric layer and having a first width substantially increasing towards the low-density conductive structure; and
  - a second via comprising a second portion in the dielectric layer and having a second width substantially decreasing towards the low-density conductive structure,
- wherein the first via and the second via are exposed by the surface of the dielectric layer.

15. The substrate structure as claimed in claim 14, wherein the high-density conductive structure comprises a patterned conductive layer on the dielectric layer, and the first via further comprises a third portion protruded beyond the dielectric layer and horizontally overlapping the patterned conductive layer.

16. The substrate structure as claimed in claim 14, wherein the high-density conductive structure comprises a patterned conductive layer on the dielectric layer, and the second via further comprises a third portion protruded beyond the dielectric layer and horizontally overlapping the patterned conductive layer.

17. The substrate structure as claimed in claim 14, wherein the low-density conductive structure comprises a third via having a width substantially increasing towards the high-density conductive structure.

18. The substrate structure as claimed in claim 17, further comprising a seed layer between the second via and the third via.

* * * * *